US006909389B1

(12) United States Patent
Hyde et al.

(10) Patent No.: US 6,909,389 B1
(45) Date of Patent: Jun. 21, 2005

(54) METHOD AND APPARATUS FOR CALIBRATION OF AN ARRAY OF SCALED ELECTRONIC CIRCUIT ELEMENTS

(75) Inventors: John D. Hyde, Corvallis, OR (US); David L. Kaplan, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 151 days.

(21) Appl. No.: 10/281,384

(22) Filed: Oct. 24, 2002

Related U.S. Application Data
(60) Provisional application No. 60/389,267, filed on Jun. 14, 2002.

(51) Int. Cl.[7] ................................................ H03M 1/66
(52) U.S. Cl. ........................ 341/144; 341/135; 341/136
(58) Field of Search ............................... 341/118, 119, 341/120, 133, 134, 135, 136, 144, 153

(56) References Cited

U.S. PATENT DOCUMENTS

| | | | |
|---|---|---|---|
| 3,958,236 A | | 5/1976 | Kelly |
| 4,037,242 A | | 7/1977 | Gosney |
| 4,763,105 A | | 8/1988 | Jenq |
| 4,783,783 A | | 11/1988 | Nagai et al. |
| 4,864,215 A | | 9/1989 | Schouwenaars et al. |
| 4,914,440 A | * | 4/1990 | Ramet .......................... 341/140 |
| 4,935,702 A | | 6/1990 | Mead et al. |
| 5,059,920 A | | 10/1991 | Anderson et al. |

(Continued)

FOREIGN PATENT DOCUMENTS

| | | |
|---|---|---|
| EP | 0 298 618 | 1/1989 |

OTHER PUBLICATIONS

Diorio, et al., "Adaptive CMOS: From Biological Inspiration to Systems-on-a-Chip"; IEEE, vol. 90, No. 3; Mar. 2002; pp 345–357.

Hyde, et al.; "A Floating–Gate Trimmed, 14–Bit, 250 Ms/s Digital-to-Analog Converter in Standard 0.25 um CMOS", Impinj, 2002 Symposium on VLSI Circuits, Honolulu HI; pp 328–331.

Yoshio, Patent Abstract of Japan, "Multiple Semiconductor Variable Capacitance Element", Publication No.: 57188886, Publication date: Nov. 19, 1982.

Carley, L. Richard, "Trimming Analog Circuits Using Floating–Gate Analog MOS Memory", IEEE Journal of Solid–State Circuits, vol. 24, No. 6, pp. 1569–1575, Dec. 1989.

Partial International Search for International Application No. PCT/US03/31792, date mailed Apr. 2, 2004.

Bastos, et al., "A 12–bit Intrinsic Accuracy High–Speed CMOS DAC", IEEE Journal of Solid–State Circuits, vol. 33, No. 12, Dec. 1998, pp. 1959–1969.

(Continued)

*Primary Examiner*—Howard L. Williams
(74) *Attorney, Agent, or Firm*—Thelen Reid & Priest LLP; David B. Ritchie

(57) ABSTRACT

A method and apparatus for calibrating an electronic circuit which required scaled matching of some or all of its electronic components with nonvolatile programmably trimmable parameter sources (current, voltage, resistance, capacitance) is carried out in a top-down (highest order bit first, lowest order bit last) fashion without an analog division step. The method and apparatus are applicable, for example, to current-steering digital-to-analog converters (DACs), voltage-controlled oscillators (VCOs), voltage-steering DACs, and the like. In each of these applications the method and apparatus is used to match successive device outputs according to a desired scale factor, proceeding top-down from large output devices to smaller output devices, thereby successively shrinking the cross-device errors which accrue during the matching process.

55 Claims, 14 Drawing Sheets

U.S. PATENT DOCUMENTS

| | | | |
|---|---|---|---|
| 5,068,622 A | 11/1991 | Mead et al. | |
| 5,146,106 A | 9/1992 | Anderson et al. | |
| 5,166,562 A | 11/1992 | Allen et al. | 307/571 |
| 5,243,347 A | 9/1993 | Jackson et al. | 341/144 |
| 5,332,997 A | 7/1994 | Dingwall et al. | |
| 5,376,935 A * | 12/1994 | Seligson | 341/136 |
| 5,627,392 A | 5/1997 | Diorio et al. | 257/315 |
| 5,666,118 A | 9/1997 | Gersbach | 341/120 |
| 5,710,563 A | 1/1998 | Vu et al. | 341/161 |
| 5,790,060 A | 8/1998 | Tesch | 341/119 |
| 5,793,231 A * | 8/1998 | Whittaker | 341/134 |
| 5,825,063 A | 10/1998 | Diorio et al. | 257/316 |
| 5,825,317 A * | 10/1998 | Anderson et al. | 341/120 |
| 5,841,384 A | 11/1998 | Herman et al. | |
| 5,870,044 A | 2/1999 | Dell'ova et al. | 341/120 |
| 5,898,613 A | 4/1999 | Diorio et al. | 365/185.03 |
| 5,933,039 A | 8/1999 | Hui et al. | |
| 5,939,945 A | 8/1999 | Thewes et al. | |
| 5,952,946 A | 9/1999 | Kramer et al. | |
| 5,955,980 A | 9/1999 | Hanna | 341/120 |
| 6,118,398 A | 9/2000 | Fisher et al. | 341/144 |
| 6,130,632 A | 10/2000 | Opris | 341/120 |
| 6,134,182 A | 10/2000 | Pilo et al. | |
| 6,169,503 B1 | 1/2001 | Wong | |
| 6,191,715 B1 | 2/2001 | Fowers | |
| 6,317,066 B1 | 11/2001 | Chiang | |
| 6,320,788 B1 | 11/2001 | Sansbury et al. | |
| 6,583,740 B2 * | 6/2003 | Schofield et al. | 341/120 |
| 2001/0020861 A1 | 9/2001 | Hirose | |
| 2001/0054920 A1 | 12/2001 | Tsujino | |
| 2002/0089440 A1 | 7/2002 | Kranz et al. | 341/143 |

OTHER PUBLICATIONS

Bugeja, et al., "A Self–Trimming 14–b 100–MS/s CMOS DAC", IEEE Journal of Solid–State Circuits, vol. 35, No. 12, Dec. 2000, pp. 1841–1852.

Bugeja, et al., "A 14–b, 100–MS/s CMOS DAC Designed for Spectral Performance", IEEE Journal of Solid–State Circuits, vol. 34, No. 12, Dec. 1999, pp. 1719–1732.

Diorio, et al., "A Floating–Gate MOS Learning Array with Locally Computed Weight Updates" IEEE Transactions on Electron Devices, vol. 44, No. 12, Dec. 1997, pp. 1–10.

Diorio, et al., "A High–Resolution Non–Volatile Analog Memory Cell", IEEE, 1995, pp. 2233–2236.

Tille, et al., "A 1.8–V MOSFET–Only Σ Δ Modulator Using Substrate Biased Depletion–Mode MOS Capacitors in Series Compensation", IEEE, Journal of Solid–State Circuits, vol. 36, No. 7, Jul. 2001, pp. 1041–1046.

Van der Plas, et al., "A 14–bit Instrinsic Accuracy $Q^2$ Random Walk CMOS DAC", IEEE Journal of Solid–State Circuits, vol. 34, No. 12, Dec. 1999, pp. 1708–1718.

Vittoz, "Dynamic Analog Techniques", Design of MOS VLSI Circuits for Telecommunications, 1985, pp. 145–170.

Vittoz, "Dynamic Analog Techniques", Design of Analog–Digital VLSI Circuits for Telecommunications and Signal Processing, Chapter 4, 1994, pp. 97–124.

Vittoz, "Continuous–Time Filters", Design of Analog–Digital VLSI Circuits for Telecommunications and Signal Processing, Chapter 6, 1994, pp. 177–211.

Vittoz, "Analog–Digital Conversion Techniques for Telecommunications Applications", Design of Analog–Digital VLSI Circuits for Telecommunications and Signal Processing, Chapter 9, 1994, pp. 289–315.

Vittoz, "Delta–Sigma Data Converters", Design of Analog–Digital VLSI Circuits for Telecommunications and Signal Processing, Chapter 10, 1994, pp. 317–339.

Yoshizawa, et al., "MOSFET–Only Switched–Capacitor Circuits in Digital CMOS Technology", IEEE Journal of Solid–State Circuits, vol. 34, No. 6, Jun. 1999, pp. 734–747.

* cited by examiner

METHOD AND APPARATUS FOR CALIBRATION OF AN ARRAY OF SCALED ELECTRONIC CIRCUIT ELEMENTS

STATEMENT OF RELATED CASE

This patent application claims the benefit of U.S. Provisional Patent Application Ser. No. 60/389,267 filed Jun. 14, 2002 in the name of John D. Hyde and commonly assigned herewith. The present invention is also related to the invention described in U.S. patent application Ser. No. 09/929,652 filed on Aug. 13, 2001 in the name of inventors John D. Hyde, Miguel E. Figueroa, Todd E. Humes, Christopher J. Diorio, Terry D. Hass and Chad A. Lindhorst and commonly assigned herewith.

FIELD OF THE INVENTION

The present invention is directed to the field of electronic circuits which require scaled matching (calibration) of some or all of their internal electronic components. The calibration procedure is carried out in a top-down (highest order bit first, lowest order bit last) fashion.

BACKGROUND OF THE INVENTION

Electronic circuits that make use of scaled matching of internal electronic components are common. For example, digital-to-analog converters are well known in the art. These devices take an input digital word and output an analog value corresponding to the magnitude of the digital input word. The current-steering type of DAC provides its analog output as a current value. Thus, as typically configured, a small magnitude digital input word results in a small output current and a large magnitude digital input word results in a correspondingly large output current. Current steering DACs are useful in a plethora of applications, particularly any type of application where digital control is used and an analog output is required. For example, emerging standards for communications systems require DACs with sample rates in the hundreds of millions of samples per second and resolutions of 10–14 bits or more. The sample rate is simply the number of times per unit time period that the DAC looks at a new input and generates a new output. The resolution refers to the size in bits of the digital input word. A one-bit resolution would correspond to only two possible output states. A 14-bit resolution corresponds to $2^{14}$ (16384) output states.

In a 14-bit converter, for example, the current produced by the largest bit must be 8192 times larger than the current produced by the smallest bit, with an accuracy better than half the size of the smallest bit (i.e. the fractional error in the largest bit must be less than 1 part in 16384). Due at least in part to mismatch between current-source transistors, it is typically very difficult to fabricate physical circuits with such resulting accuracy. Accordingly, it is common to utilize a mechanism for trimming or tuning the DAC after its fabrication so that the current-source transistors behave nearly ideally after trimming. In the past, such trimming mechanisms have included, for example, laser-trimmable components, such as cermet or nichrome resistors. Large transistors have also been used to try to minimize mismatch. Such approaches are usually undesirable because they increase the die area used by the DAC. Moreover, trimmable resistor components are usually undesirable because they take relatively large amounts of die area and require special processing steps not compatible with system-on-chip (SOC) integration. Randomized layouts have also been used, as have architectures where plural transistors are used for each current steering element in order to average out performance differences among nearly identical transistors. Such intrinsic matching approaches generally require complicated layout techniques that usually result in a substantial adverse impact on die size and chip yield. Electrical trimming with on-chip capacitors has been used but requires continuous calibration of the current sources in the DAC because the calibration information held in the capacitors is continuously degrading due to leakage currents. Continuous calibration approaches are undesirable in general because they suffer from the effects of switching noise and require complicated circuitry to adjust current sources on the fly without impacting the performance of the DAC.

Electrically-trimmable DACs typically use thermometer-decoded current sources, largely because trimming identical current sources against a fixed reference current is much easier than trimming binary-weighted current sources. However, trimming an N-bit thermometer-decoded DAC requires $2^N$ trim steps. Alternatively, a binary-weighted DAC requires only N trim steps, but a more complicated trimming procedure requiring accurate scaling of either the current reference or the trimmed current.

Existing trim procedures for binary-weighted DACs are typically "bottom-up", meaning that first the second significant bit ($2^{sb}$) magnitude is trimmed to twice the least-significant bit (LSB) magnitude, then the $3^{sb}$ is trimmed to twice the $2^{sb}$ magnitude, then the $4^{sb}$ is trimmed to twice the $3^{sb}$ magnitude, etc. Bottom-up trimming is attractive because doubling (or otherwise scaling) a bit's magnitude requires the simple operations of either analog addition or analog multiplication, but has the potential drawback that small errors in a bit are doubled at each trim step, necessitating a large trim range. In a "top-down" trim, first the $(N-1)^{th}$ significant bit magnitude would be made equal to half the $N^{sb}$ magnitude, then the $(N-2)^{th}$ significant bit magnitude would be made equal to half the $(N-1)^{th}$ bit magnitude, etc. Top-down trim would be attractive because trim errors are halved at each trim step, reducing the required trim range, however, the apparent requirement for halving a bit's magnitude by means of the relatively difficult operation of analog division presents a significant drawback to its implementation.

BRIEF DESCRIPTION OF THE INVENTION

A method and apparatus for calibrating an electronic circuit which requires scaled matching of some or all of its electronic components with nonvolatile programmably trimmable parameter sources (current, voltage, resistance, capacitance) is carried out in a top-down (highest order bit first, lowest order bit last) fashion without an analog division step. The method and apparatus are applicable, for example, to current-steering digital-to-analog converters (DACs), voltage-controlled oscillators (VCOs), voltage-steering DACs, and the like. In each of these applications the method and apparatus is used to match successive device outputs according to a desired scale factor, proceeding top-down from large output devices to smaller output devices, thereby successively shrinking the cross-device errors which accrue during the matching process.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
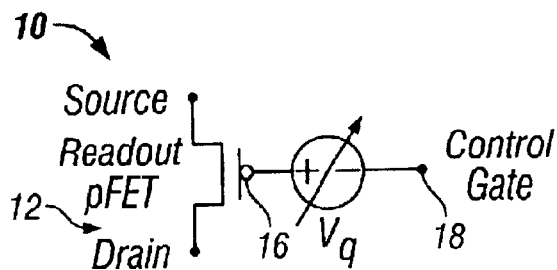
FIG. 1 is a conceptual circuit model of a pFET floating-gate transistor in accordance with one embodiment of the present invention.

Embodiments of the present invention are described herein in the context of a method and apparatus implementing a top-down calibration procedure in a trimmable electronic circuit comprising elements that require scaled matching for optimal performance. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

A new top-down trim procedure and a corresponding trim circuit that does not require analog division, enabling top-down calibration in various types of circuits is now described.

The present invention is applicable to any electronic circuit that requires scaled matching of some or all of its internal devices. The invention accomplishes top-down scaled matching by exploiting the following algebraic identity:

$$k^N = 1 + (k-1)\sum_{i=0}^{N-1} k^i$$

Examples of circuits that can benefit from the present invention include the following:

1) A current-steering digital-to-analog converter (DAC) which may contain an internal array of transistor-based current sources which are intended to emit scaled multiples of some base reference value (1×, 2×, 4×, 8×, etc.), in order to produce an analog current output which accurately reflects an input digital code word;

2) A voltage-controlled oscillator (VCO) which may contain an internal array of capacitor-based voltage sources which are intended to emit scaled multiples of some base reference value, in order to produce a specific analog voltage which in turn causes the VCO to deliver an output signal of a specific frequency; and 3) A voltage-steering digital-to-analog converter (DAC) which may contain an internal array of capacitor-based voltage sources which are intended to emit scaled multiples of some base reference value, in order to produce an analog voltage output which accurately reflects an input digital code word.

In each of these applications, the present invention can be used to match successive device outputs according to a desired scale factor, proceeding top-down from larger devices to smaller, thereby successively shrinking the cross-device errors which accrue during the matching process.

The detailed discussion below relates first to an implementation of the invention to a current-steering DAC, using a scale factor of k=2. Then the discussion turns to a generic implementation of the invention. Those of ordinary skill in the art, having the benefit of this disclosure, will now realize that the invention is applicable to a wide range of circuits which implement scaled matching. It is not required that the circuit be implemented in base 2 and it is not intended to be limited solely to DACs and VCOs.

In the past, designers have used several methods to trim digital-to-analog converters. For applications that use one-time calibration (in the factory) rather than continuous calibration (post-factory), the DAC output can be measured using laboratory equipment, and computers can decide changes to the DAC current sources. This approach has the advantage that the computer can easily calculate any trim algorithm or value. It has the disadvantage that it requires high-accuracy laboratory equipment, is slow (because it requires off-chip computation), and does not allow post-factory DAC calibration, which is often required to compensate for temperature and other variations in operating conditions. In general, factory calibration methods increase the processing cost of producing the DAC, because of the extra equipment, processing steps, and test time involved in calibration.

For applications that require post-factory electrical calibration (either frequent or infrequent), the trimming algorithm and circuitry must be contained either on-chip, or located in nearby chips. For example, Bugej a, et al, demonstrated a trimming method in their paper *A Self-Trimming 14b 100 Msample/s CMOS ADC*, Proceedings of I.E.E.E. ISSCC 2000, pp. 44–45 (2000). In the scheme, a trim DAC and highly oversampled delta-sigma modulator were used to adjust only the unary thermometer-decoded MSB segments. This approach required a large amount of area to accommodate the measurement and comparison circuitry used to trim the MSBs. Ideally, the trimming algorithm should use a single comparator (or a small number of comparators) rather than high-resolution measurement circuitry. Also, the algorithm should be sufficiently simple that it can be implemented on chip. Existing trim procedures are typically bottom-up (IMPJ-003, patent application Ser. No. 09/929, 652): First the $2^{sb}$ is compared to the sum of two LSBs using a single comparator; if the $2^{sb}$ is too large or too small, it is trimmed down or up, respectively. Then the $3^{sb}$ is compared to the sum of two LSBs plus the trimmed $2^{sb}$; if the $3^{sb}$ is too large or too small, it is trimmed down or up, respectively. In a similar fashion all the bits can be trimmed, using only the operations of addition and comparison. Addition of currents is trivially easy (requires summing the current-source currents on a wire), and comparison is a simple binary operation. A primary disadvantage of bottom-up trim is that small errors in a low-order bit are doubled at each trim step, necessitating a large trim range. In general, post-factory calibration methods increase the manufacturing cost of producing the DAC, because of the extra circuitry and time required to accomplish calibration.

The present invention sets forth a new top-down trim procedure and a corresponding trim circuit that do not require analog division, thereby enabling top-down trim in digital-to-analog converters. This invention is generally applicable to current- steering digital-to-analog converters and similar devices that make use of scaled matching of components.

In addition to avoiding the difficulty of analog division, the present invention has a number of advantages when compared with other trimming methods: the invention achieves the high accuracy of factory trimming methods, without their higher processing costs and their inability to compensate for changes in field operating conditions; and, compared with other post-factory trimming methods, the invention uses relatively simple on-chip circuitry to perform its trimming process.

Floating-gate transistors are used herein in the trim cells. These transistors are conventional transistors with the following additional attributes: (1) nonvolatile analog weight storage, (2) locally computed bidirectional weight updates, and (3) simultaneous memory reading and writing. Such transistors are described, for example, in U.S. Pat. Nos. 5,627,392; 5,825,063 and 5,898,613 to Diorio et al. P-channel floating-gate MOSFETs (pFETs) are used in accordance with one embodiment of the present invention. pFET floating-gate transistors use charge stored on a floating gate to represent the nonvolatile analog weight, electron tunneling and hot-electron injection to modify the stored charge bidirectionally, and allow simultaneous memory reading and writing by nature of the mechanisms used to write the memory. The pFET floating-gate transistor is discussed in detail herein because of its inherent compatibility with standard CMOS processing. Other types of floating-gate transistors (such as nFETs) and other charge storage and transport mechanisms could also be used as will now be appreciated by those of ordinary skill in the art.

Figure 2A:
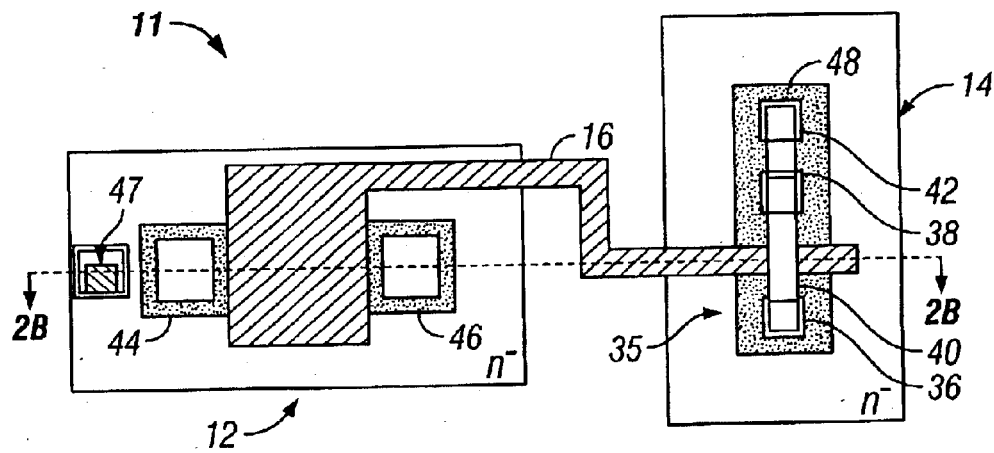
FIG. 2A is a layout view of a pFET floating-gate transistor in accordance with one embodiment of the present invention.
Figure 2B:
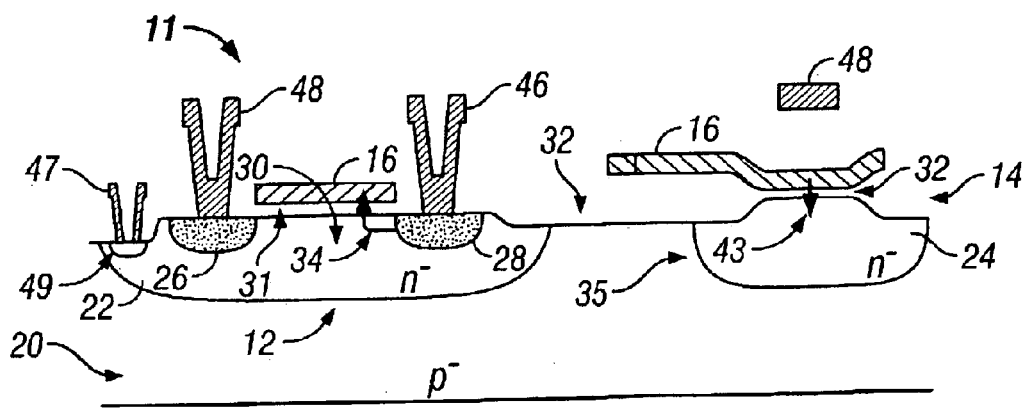
FIG. 2B is a vertical cross-sectional view of a pFET floating-gate transistor taken along line 2B—2B of FIG. 2A.
Figure 2C:
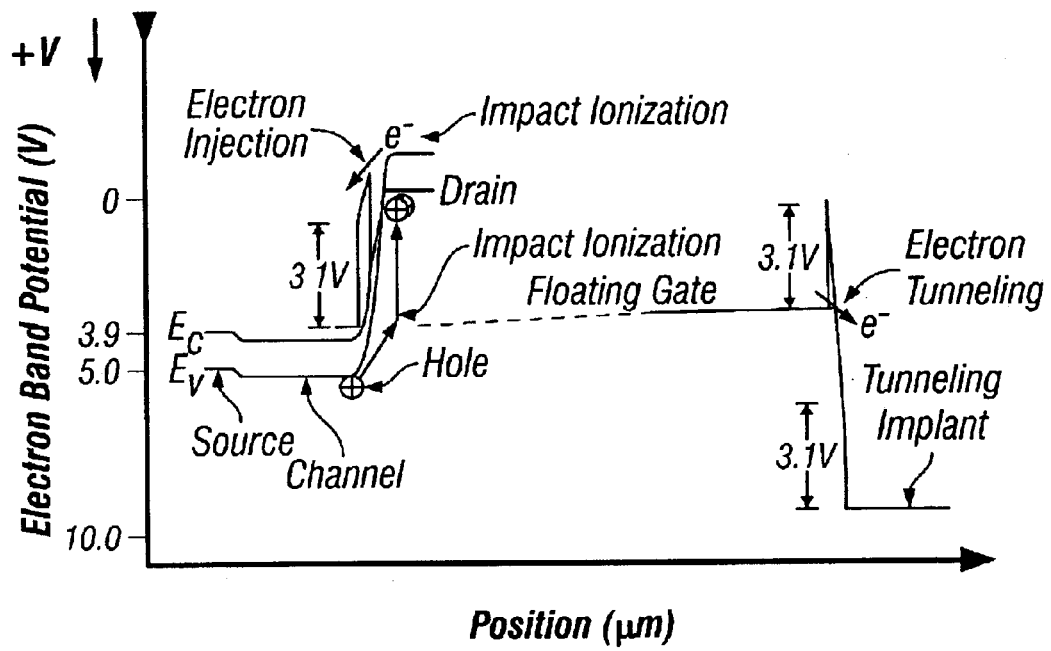
FIG. 2C is a band diagram of a pFET floating-gate transistor in accordance with FIG. 2A.

A conceptual circuit model 10 for a pFET floating-gate transistor 10 is illustrated in FIG. 1. Electron tunneling and injection modify the gate offset voltage $V_q$. A layout view of an example of one embodiment of this transistor is illustrated in FIG. 2A. A cross-sectional view taken along line 2B—2B of the transistor 11 of FIG. 2A is illustrated in FIG. 2B and the band diagram for the transistor 11 is illustrated in FIG. 2C. The transistor 11 comprises two MOSFETs: the first is a readout transistor 12; the second, with shorted drain and source, forms a tunneling junction 14. The floating gate 16 is disposed over both readout transistor 12 and tunneling junction 14. Removing electrons from or adding electrons to the floating gate 16 shifts the readout pFET's threshold voltage bidirectionally. The transistor 11 in accordance with one embodiment of the present invention primarily uses Fowler-Nordheim (FN) tunneling to remove electrons from its floating gate 16, and impact-ionized hot-electron injection (IHEI) to add electrons to the floating gate 16. For a discussion of IHEI, see,. e.g., C. Diorio, P. Hasler, B. A. Minch and C. Mead, *"A floating-gate MOS learning array with locally computed weight updates"*, IEEE Trans. Electron Devices, vol. 44, no. 12, pp. 2281–2289 (1997). Because the floating-gate transistors used in this embodiment are used as current sources, there is no need for a gate input, accordingly, the version of the floating-gate transistor shown in FIGS. 2A, 2B and 2C lacks a control gate and hence obviates the need for a second layer of highly-doped polycrystalline silicon (poly2) ensuring compatibility with standard digital CMOS processing. Where such a control gate is required, it may, of course, be provided.

Turning now in detail to FIGS. 2A and 2B, the pFET transistor 11 is formed in a p– doped substrate 20 (doping level on the order of $10^{17}$ atoms/cc) although those of ordinary skill in the art will now realize that it could as easily be formed as a thin film transistor (TFT) above the substrate, or on an insulator (SOI) or on glass (SOG). Essentially, any process capable of forming pFETs and nFETs will work. In substrate 20 are formed a first n– doped well 22 (doping level on the order of $10^{17}$ atoms/cc) and a second n– doped well 24 (doping level on the order of $10^{17}$ atoms/cc). In first n– well 22 are formed a pair of p+ doped regions 26, 28 which may be diffusions or implants (doping level on the order of $10^{21}$ atoms/cc) which form, respectively, the source 26 and drain 28 of readout transistor 12. A channel 30 is formed between source 26 and drain 28. Over channel 30 is disposed a high quality gate oxide (typically $SiO_2$) 32 of a thickness commensurate with the voltages to be used in the application. In accordance with one embodiment of the present invention, the gate oxide 32 has a thickness in a range of about 70 angstroms to about 110 angstroms in the region above the channel 30. Over gate oxide layer 32 above channel 30 is disposed floating gate 16. When drain 28 has a sufficiently negative voltage relative to source 26, positively charged holes will be accelerated in channel 30 toward drain 28 and will impact with the crystalline lattice in the region of drain 28 creating an electron-hole pair. The electron is then repelled by the relatively negative drain are thereby injected (34) across the gate oxide layer 32 onto floating gate 16. In second n− doped well 24 is formed a "shorted" pFET 35, i.e., a pFET with its drain 36 and source 38 preferably shorted together with a metal or heavily-doped polycrystalline silicon conductor 40. It is possible to forego the shorting conductor 40 because when floating gate 16 has sufficient charge (i.e., positive charge) stored on it and the source 38 of pFET 35 is held at a relatively positive voltage, pFET 35 will conduct and effectively be "shorted". In one embodiment, conductor 40 overlies floating gate 16 in the region of tunneling junction 14 as shown. An n+ region 42 (doping level on the order of $10^{21}$ atoms/cc) is formed in n− well 24 and is also preferably (but not necessarily) shorted to drain 36 and source 38 by conductor 40. Tunneling occurs between floating gate 16 and n− well 24 in region 43 as shown when a sufficiently positive voltage is applied to n− well 24 via n+ region 42. A source contact terminal 44, a drain contact terminal 46 and an n+ region contact terminal 48 are provided. A well contact terminal 47 coupled to an n+ region 49 (doping level on the order of $10^{21}$ atoms/cc) in n− well 22 may also be provided. It should generally be tied to a source of positive potential. It may be strapped to the source 26.

The tunneling junction 14 comprises a shorted pFET in an n− well for two primary reasons. First, a lightly-doped n− well can accommodate relatively high positive voltage without pn-junction breakdown to the substrate. Second, a shorted pFET in an n− well is a valid structure (that is, it satisfies the design rules) in any CMOS process.

Key features of the floating-gate transistor 11 illustrated at FIGS. 2A, 2B and 2C are (a) the readout transistor 12 remains a fully functional p-channel MOSFET; (b) relatively high voltages applied to the tunneling junction 14 tunnel electrons off the floating gate 16; (c) relatively large drain-to-source (26 to 28) voltages cause IHEI at the drain 28, injecting electrons onto the floating gate 16. Those of ordinary skill in the art will now realize that other mechanisms for injecting charge onto the floating gate may also be used, including tunneling.

DAC Implementation

Figure 3:
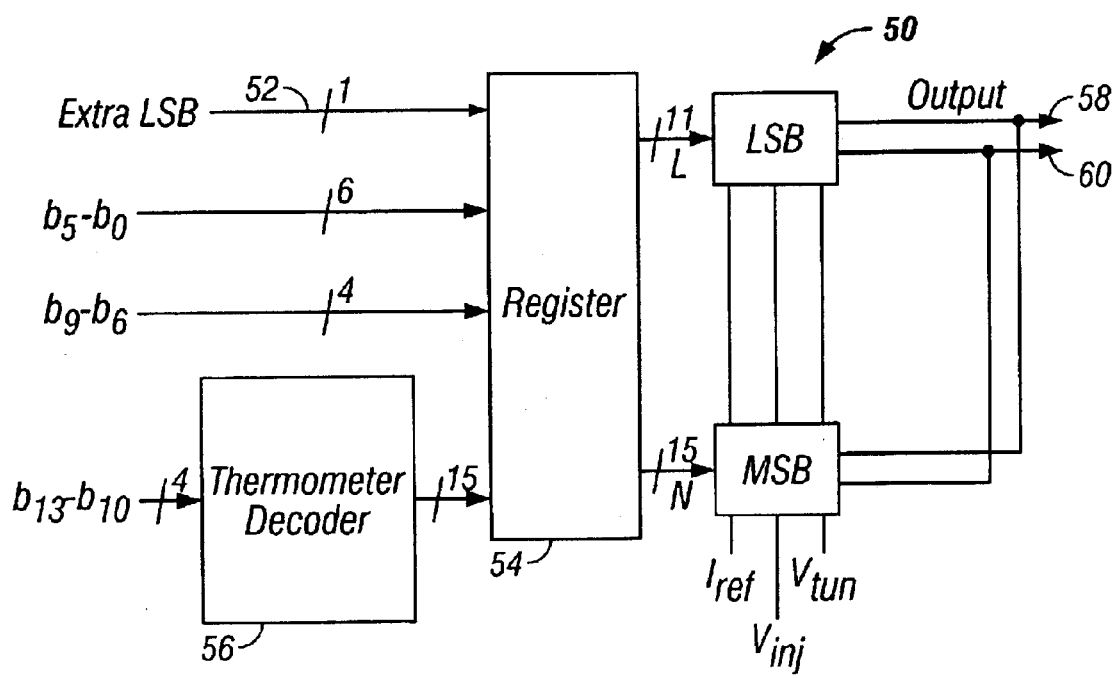
FIG. 3 is a system block diagram of a digital-to-analog converter (DAC) in accordance with an embodiment of the present invention.

FIG. 3 is a block diagram of a DAC 50 built in accordance with one embodiment of the present invention. In accordance with the embodiment of the DAC 50 shown in FIG. 3, a segmented current-source architecture with L (11) binary-decoded LSBs (least significant bits) (LSB) and N (4) thermometer-decoded MSBs (most significant bits) is used. The on-hip calibration circuitry (not shown) trims the current sources in the LSB and MSB segments. The LSB segment also includes an extra LSB current-source 52 (discussed below), used for calibration. The lower 10 input bits drive binary-weighted current-source arrays (10LSB), while the upper 4 bits are thermometer decoded with conventional thermometer decoder 56 to drive 15 identical current sources. The DAC 50 features a-differential current output: each bit of the digital register controls a switch that steers the output from each current source in LSB and MSB to one of the two output terminals 58, 60. There is a global current reference ($I_{REF}$), and one global voltage ($V_{TUN}$) that control the injection and tunneling processes while the current sources are trimmed.

It should be noted that while a conventional static binary data register 54 is shown located on-chip in FIG. 3 to latch the 14 bit input codeword, there is no requirement for such a register and the bits could be received by the DAC in any other conventional manner without the use of an on-chip register.

As will now be apparent to those of ordinary skill in the art, the approach shown in FIG. 3 is designed to achieve 14-bit resolution (1 in 16384) without the need for intrinsically matched current sources. Thus the LSB current sources are digitally decoded (i.e., 1, 2, 4, 8, etc.) and the MSB current sources are thermometer decoded (i.e., 0000, 0001, 0011, 0111, etc.) and may use smaller devices and simpler layouts to reduce die size.

Figure 4:
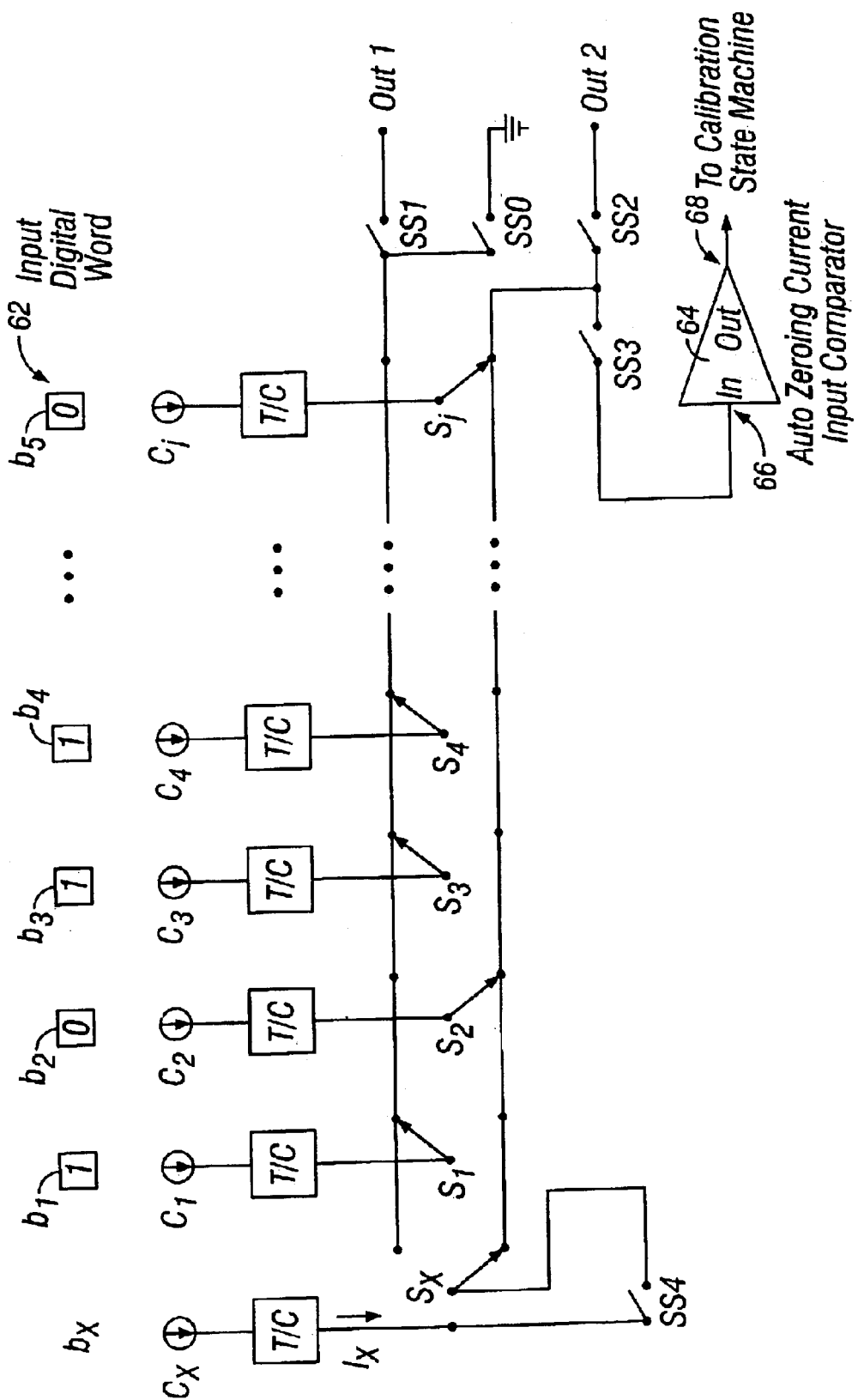
FIG. 4 is a simplified electrical schematic diagram of a current-steering DAC in accordance with an embodiment of the present invention.

FIG. 4 is a simplified electrical schematic diagram of a current-steering DAC in accordance with one embodiment of the present invention. Binary switches $S_1$-$S_j$, with their switch settings based on the input digital word 62 (the bits of which are denoted b1, b2, . . . , bj), steer current from an array of binary-weighted current sources C1, C2, . . . , Cj, to one of two outputs. $b_j$ is the $j^{th}$ bit of the digital input word, and switches the output from a current source of value $2^{j*}I$, $0 \leq j \leq N-1$. I is the current associated with the least significant bit $b_1$. N is the total number of current sources to be trimmed.

To implement top-down trimming in a DAC, we add an extra bit, $b_x$, which controls a current of the same magnitude as bit $b_1$. Each current source in the DAC has an associated trim cell (denoted T/C). The trim cell bidirectionally adjusts the current source's output by either adding or subtracting a trim current. Each trim cell contains a current mirror to optionally double the trim current, so that it operates in one of two modes: 1×(normal) or 2×(outputs twice the trim current). The trim cells will be discussed in more detail below.

As discussed above, in many current-steering DAC implementations, the design is segmented into a binary-decoded section and a thermometer-decoded section. The binary section takes the least-significant bits of the inputs and uses binary-weighted current-sources as described above. The thermometer section takes the most significant bits and runs them through a thermometer decoder. The resulting thermometer bits control an array of current sources of equal magnitude. Each of these current sources has a magnitude of twice the value of the largest current source in the binary section. The algorithm presented here can trim the binary section of such a DAC, using one of the thermometer current sources as the reference $I_R$. Trimming the thermometer current sources using the same trim cells discussed above is easily implemented, because all of the thermometer current sources are to be calibrated to an identical value. To trim the thermometer current sources, it is convenient to have a thermometer decoder with a one-hot output option, which selects only one current source at a time. The selected current source can easily be trimmed by comparing its output to a reference current source. Such a reference current source could be set, for example, to the median value of all thermometer current sources.

Figure 5A:
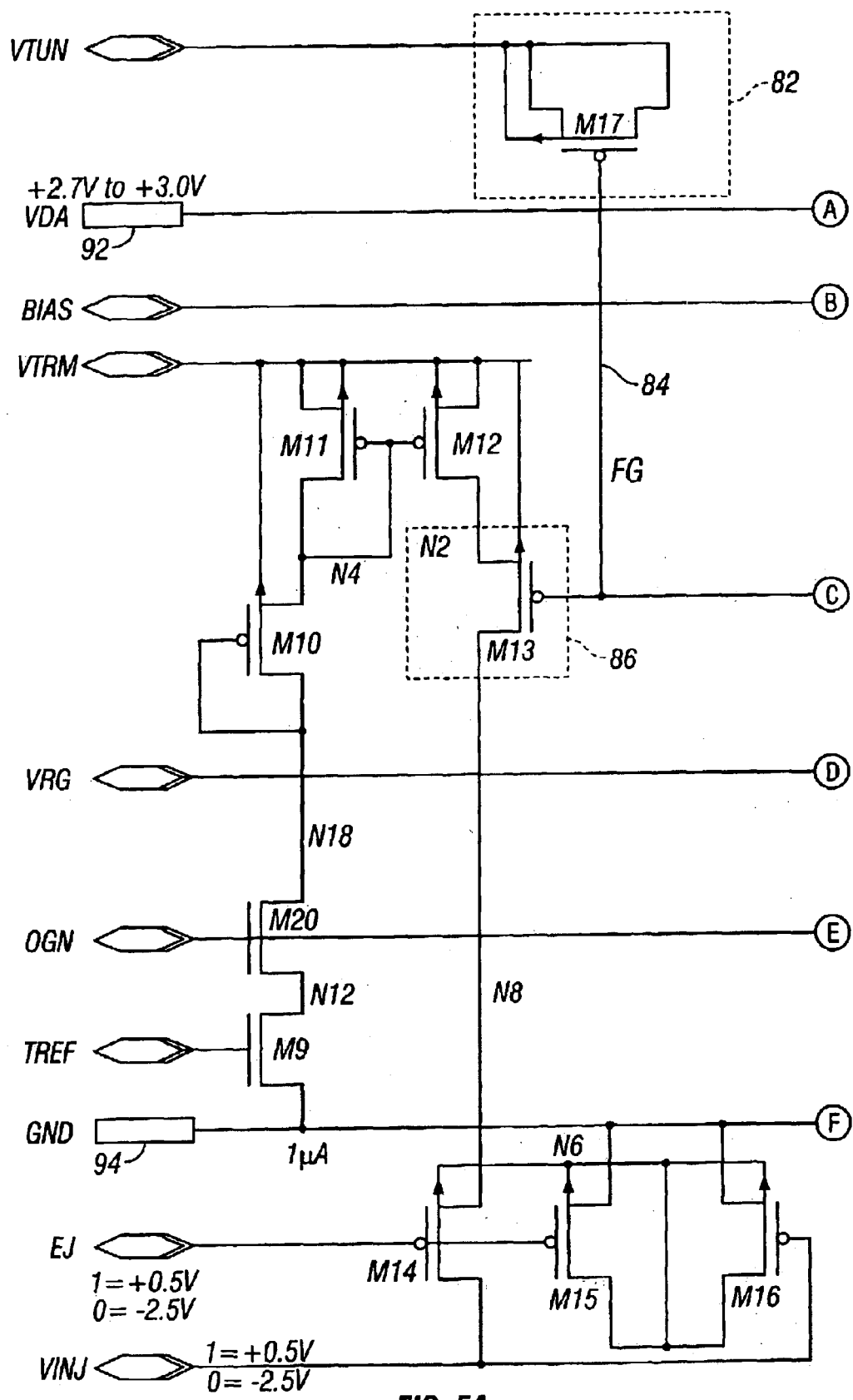
FIG. 5 is an electrical schematic diagram of one embodiment of a current trim cell in accordance with one embodiment of the present invention.
Figure 5B:
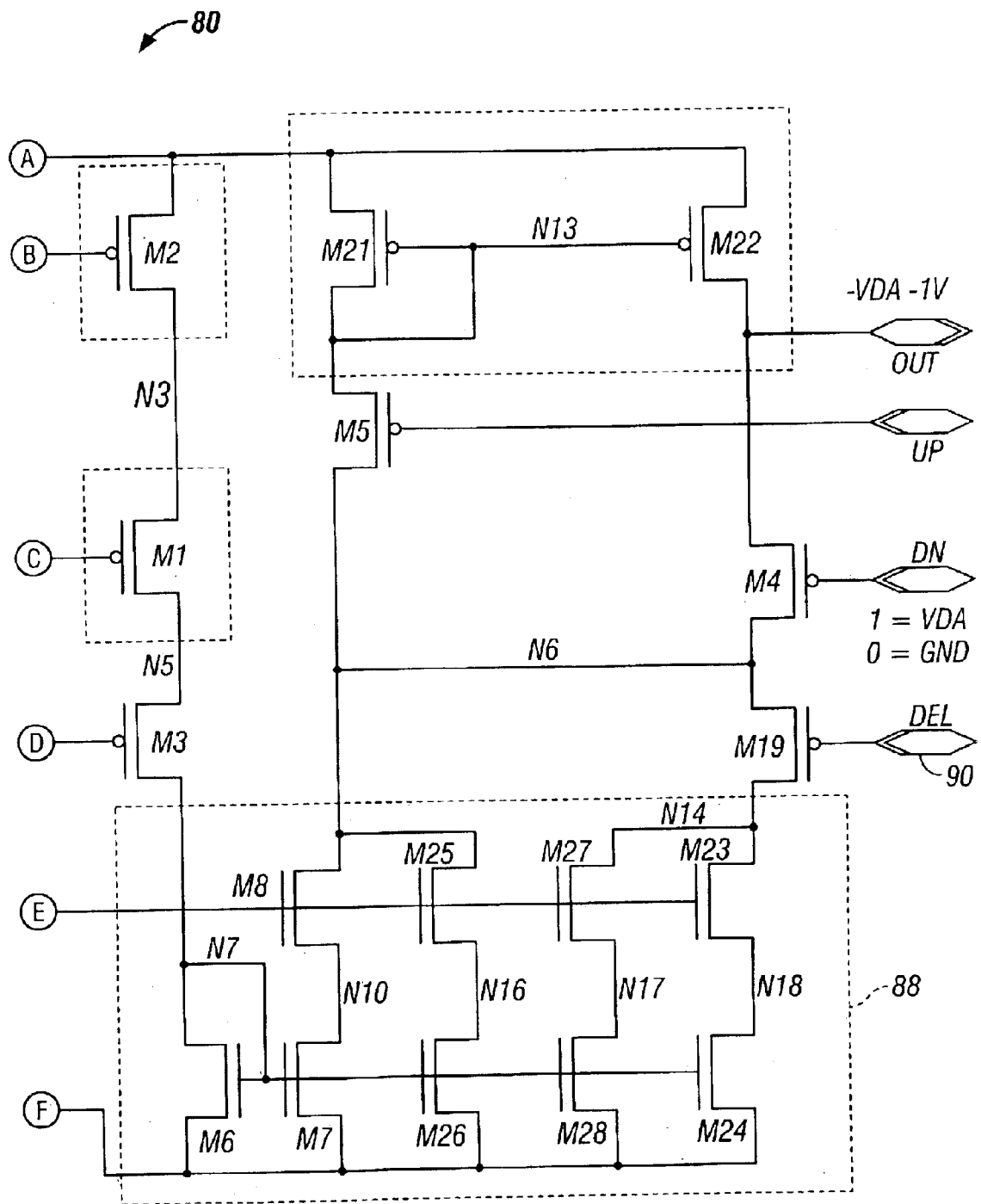

FIG. 5 is an electrical schematic diagram of one embodiment of a trim cell in accordance with the present invention. The trim cell 80 is adapted to produce an output current $I_{Ti}$ which is added to the output current $I_i$ from current source $C_i$. The circuit of FIG. 5 is not the only circuit that will perform this function, it is simply an example of one that will work. Those of ordinary skill in the art will now realize that many other circuits will work to perform the functions described for the circuit of FIG. 5.

The tunneling junction 82 removes electrons from the floating gate 84 as described above. Injection transistor 86 injects electrons onto floating gate 84 as described above.

The current mirror circuit 88 provides a 1×current output when the DBL input 90 is equal to the VDA input 92 (i.e., pMOS transistor M19 is off) and a 2×current output when DBL input 90 is 0 (ground GND 94).

In the individual trim cell circuit of FIG. 5, VDA is the supply voltage, BIAS, VRG, CGN and TREF are DC bias voltage inputs generated by a global bias voltage supply circuit (not shown). VTUN is the tunneling voltage and is connected to VDA to disable tunneling. VTRM is the injection supply voltage and is normally connected to VDA. Both EJ and VINJ are injection must be set to the logic zero state (−2.5 V nominal in this embodiment) in order to enable injection.

The drain current of PMOS current source transistor M1 is controlled by floating gate node FG (84). PMOS transistor M2 located in series with the source of M1 is operated in the triode region as a variable resistor to provide temperature compensation for the trimmed drain current of M1. The drain current of M1 is the input current to the NMOS current mirror circuit including transistors M6, M7, M26, M28 and M24. Cascode transistors M3, M8, M25, M27 and M23 are used to increase the output impedance of the current source transistors in accordance with this particular embodiment and are not essential for circuit operation. The drain current of the NMOS current mirror circuit is equal in magnitude, but opposite in direction, to the drain current of M1 when the DBL input voltage is equal to VDA. When the DBL input voltage is zero (GND), PMOS switch transistor M19 is turned on and the drain current magnitude of the NMOS current mirror circuit is doubled. The output current of the trim cell is provided at the node labeled OUT. The polarity of the output current is controlled by PMOS switch transistors M5 and M4 and the UP and DN digital control inputs. When V(UP)=0 and V(DN)=VDA, M5 will be on and M4 will be off. In this case the drain current of the NMOS current mirror at node N6 will flow through switch M5 into the PMOS current mirror of M21 and M22, and the trim cell output current will be equal to the drain current of M22. When V(UP)=VDA and V(DN)=0, M5 will be off and M4 will be on. In this case the drain current of the NMOS current mirror at node N6 will flow through switch M4 directly to the trim cell output node OUT.

We next establish definitions, and then the binary section trim procedure itself. The definitions are:

$I_R$=a reference current equal to twice the magnitude of the current source associated with bit $b_N$.

$I_x$=the total current associated with bit $b_x$ $I_{Tx}$=the trim current associated with bit $b_x$ $I_{Ui}$ the untrimmed current source current for $b_i$ $I_{Ti}$=the trim current for $b_i$ $I_i=I_{Ui}+I_{Ti}$ and is the total current associated with bit $b_i$, the bit being trimmed (bits are numbered 1 (lowest order) to N (highest order))

$\Sigma(I_{i-})$=the sum of all binary weighted current sources (total currents) associated with bits of lower order than $b_i$ $\Sigma(I_{i+})$=the sum of all binary weighted current sources (total currents) associated with bits of higher order than $b_i$ Note that in a segmented DAC, with binary and thermometer sections as described above, the reference current $I_R$ can easily be obtained by first trimming the thermometer current sources to a common value, and then using one of the trimmed thermometer current sources as the reference current $I_R$.

Note that the quantity $I_i=I_{Ui}+I_{Ti}$ is the total post-trim current for bit $b_i$. This is the desired operational trimmed current output for bit $b_i$.

Trim Procedure

Figure 6:
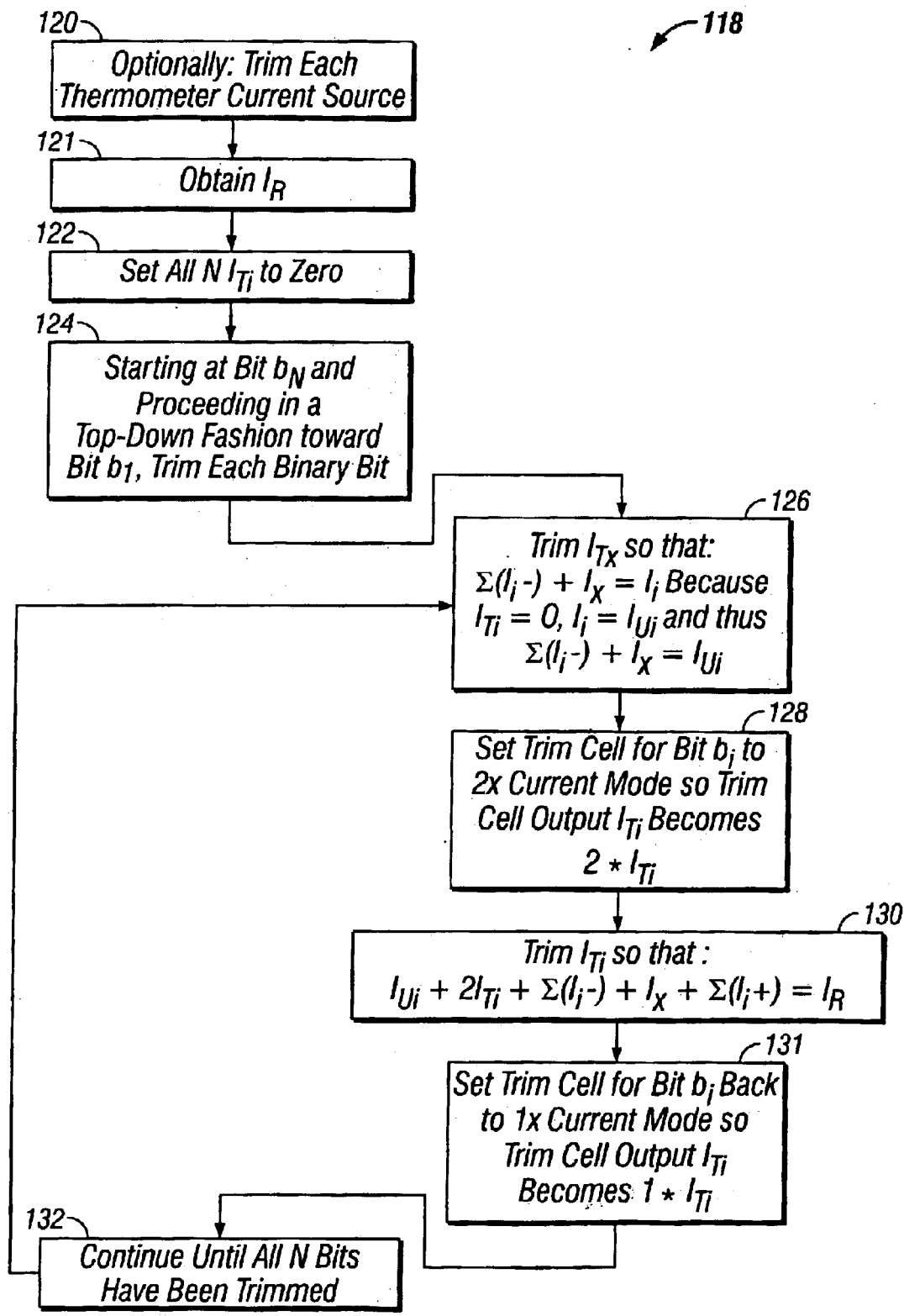
FIG. 6 is a process flow diagram illustrating a procedure for trimming the binary bits of a DAC in accordance with an embodiment of the present invention.

The trim procedure is illustrated in FIG. 6, a process flow diagram.

1. If the device includes a thermometer section, trim each thermometer current source to the median value of all thermometer current sources (120), and use one of the trimmed thermometer current sources as the reference current $I_R$ (121).

2. Zero all N $I_{Ti}$ (122).

3. Trim the binary section current sources as follows: start at bit $b_N$ and proceed down to bit $b_1$, trim each bit (124) using the following procedure:

a. Temporarily trim $I_{Tx}$ such that $\Sigma(I_{i-})+I_x =I_i$ (126). Because $I_{Ti}$ =0, $I_i=I_{Ui}$ and thus $\Sigma(I_{i-})+I_x =I_{Ui}$.

b. Set the trim cell for bit $b_i$ to 2× mode: trim cell output is now 2 ($I_{Ti}$) (128). In the claims this is referred to as "scaling" or "scale" which means to multiply by scale factor, k, which is greater than 1. In the case of 2× mode, the scale factor k=2.

c. Trim $I_{Ti}$ such that: $I_{Ui}+2 (I_{Ti})+\Sigma(I_{i-})+I_x+\Sigma(I_{i+}) =I_R$ (130).

d. Set the trim cell for bit $b_i$ back to 1× mode: trim cell output is now $I_{Ti}$ (131).

Because: $\Sigma(I_{i-})+I_x=I_{Ui}$, then $2I_{Ui}+2(I_{Ti})+\Sigma(I_{i+})=I_R$ Thus $I_i=I_{Ui}+I_{Ti}=\{I_R -\Sigma(I_{i+})\}/2$ Continue by going back to (a) until all N bits have been trimmed (132).

When trimming bit $b_N$, $\Sigma(I_{i+})=0$, so that after trim $I_N=I_R/2$. When trimming bit $b_{N-1}$, $\Sigma(I_{i+})=I_R-I_N=I_R/2$, so that after trim $I_{N-1}=I_R/4$. Thus, the algorithm succeeds in trimming each current source to a binary-weighted fraction of $I_R$. Moreover, it does so in a top-down fashion without using analog division.

Furthermore, the circuit that implements the above algorithm can use a single comparator circuit to make the calibration measurements. Those of ordinary skill will now realize that this could be implemented in any number of ways. An example of one embodiment of the present invention is illustrated in FIG. 4. FIG. 4 shows an implementation using an auto-zeroing comparator 64 with a single-ended current input 66. The calibration measurement is made by alternating the DAC output between the reference current $I_R$ and the measured current. The comparator is auto-zeroed when the reference current is applied to its input 66. The comparator stores the reference current during the auto-zero phase, and then compares this stored reference current level to the measured current during the measurement phase. The comparator digital output 68 indicates whether the measured current was greater than or less than the reference current. The comparator output 68 is used to control the calibration state machine logic (not shown). During normal DAC operation the DAC output is disconnected from the comparator by opening switch SS3 and closing switch SS2.

Extra current-source element $b_x$ can be disconnected from the DAC for normal operation by opening switch SS4.

The above algorithm and the circuit which implements it, while key to the quick, efficient implementation of the invention, are not part of the invention per se and are not crucial to the invention. The key innovations of the invention are: a post-factory trimming method which reduces, rather than magnifies, trim error stage-by-stage; avoiding the difficult operation of analog division; and, implementing said method by reference to internal operational circuit elements, rather than external, trim-dedicated elements.

Figure 7:
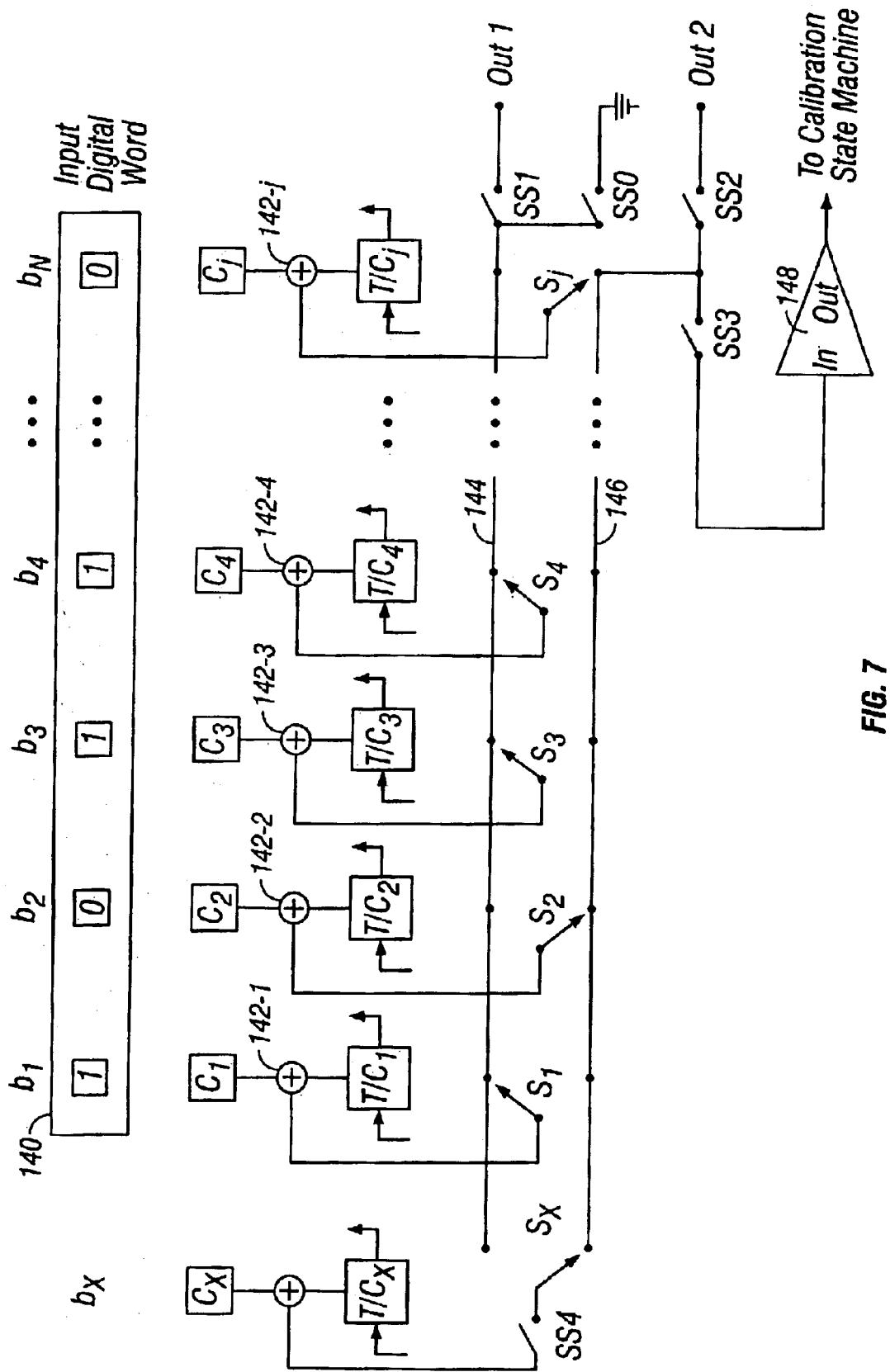
FIG. 7 is an electrical schematic diagram of one embodiment of a generic calibration system in accordance with an embodiment of the present invention.

This approach may be generalized. Turning now to FIG. 7, FIG. 7 is an electrical schematic diagram of one embodiment of a generic calibration system in accordance with an embodiment of the present invention. The approach of FIG. 7 corresponds to that of FIG. 4. An input word 140 having bits $b_i$ through $b_N$ provides a value to be converted to an output of some parameter (e.g., voltage, current, capacitance, resistance). Cells $C_1$ through $C_j$ provide relatively fixed values of the parameter corresponding to their bit positions. Trim cells, denoted $T/C_1$ through $T/C_j$ provide adjustable values of the parameter and may be trimmed by F-N tunneling to reduce the charge on a floating gate controlling the adjustable value of the parameter and IHEI to increase it. Cell outputs and trim cell outputs are summed in a series of combiners 142-1, 142-2, . . . , 142-$j$. Outputs of these combiners are directed to the inputs of switches $S_1$ through $S_j$. Switches $S_1$ through $S_j$ output to either a first bus 144 or a second bus 146 depending on the state of corresponding bit $b_j$. For non-binary implementations, additional buses and multi-state switches may be provided as will now be apparent to those of ordinary skill in the art. An additional x-bit is provided and controlled as before and includes a cell $C_x$, a trim cell $T/C_x$ and a switch $S_x$. The x-bit may be decoupled from both busses via switch SS4. In the example shown, a comparator 148 is provided. In the example shown it is an auto-zeroing comparator, however, other types of comparators could be used with fixed references to establish the calibration.

Figure 8:
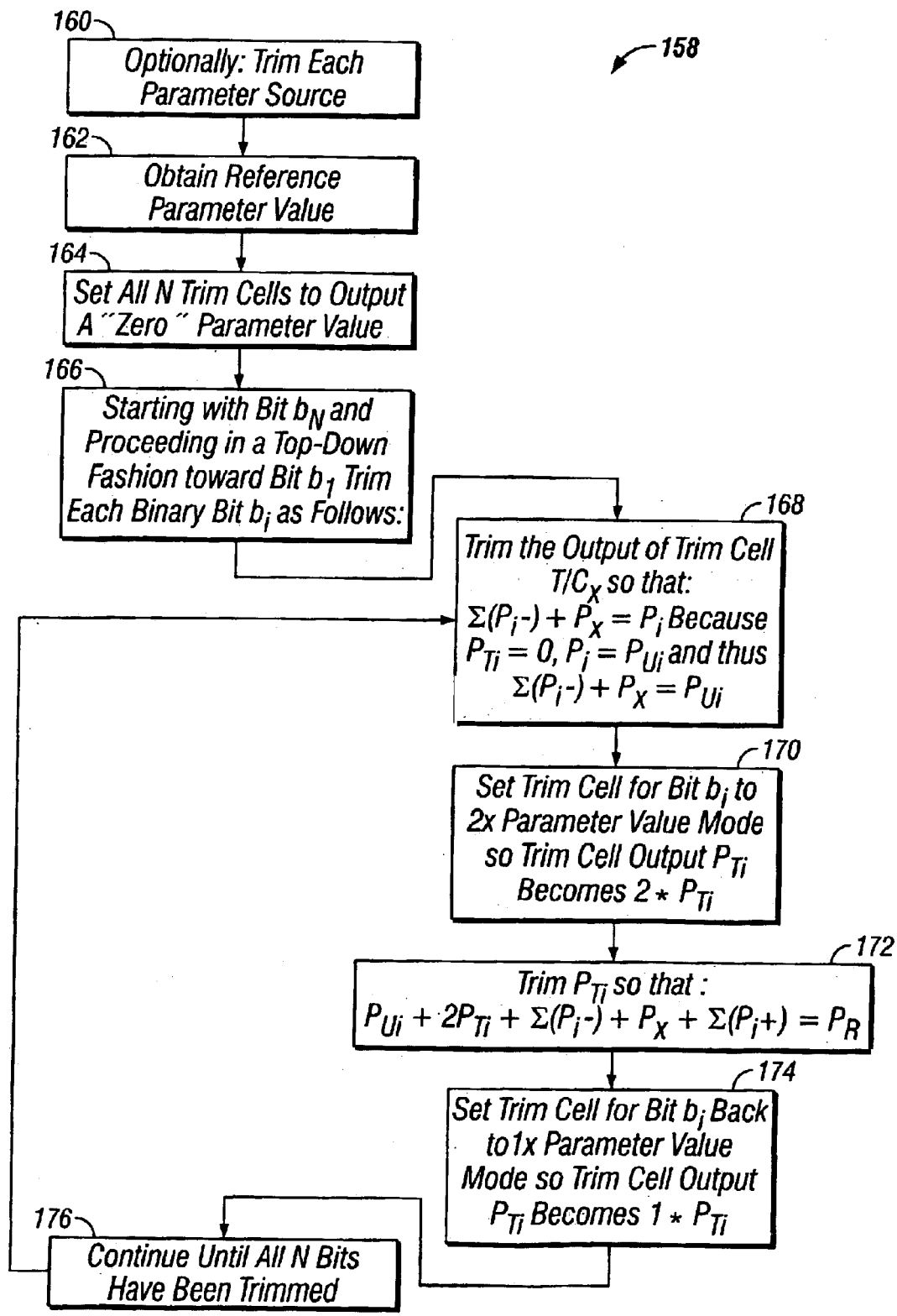
FIG. 8 is a process flow diagram illustrating a procedure for trimming the bits of a generic device in accordance with the schematic diagram of FIG. 7.

Turning now to FIG. 8, FIG. 8 is a process flow diagram illustrating a procedure 158 for trimming the bits of a generic device in accordance with the schematic diagram of FIG. 7. FIG. 8 corresponds with FIG. 6 of the DAC embodiment. The steps 160–176 of FIG. 8 correspond exactly with steps 120–132 of FIG. 6 except that in FIG. 8 the generic parameter "P" is used instead of current "I" as in FIG. 6.

Figure 9:
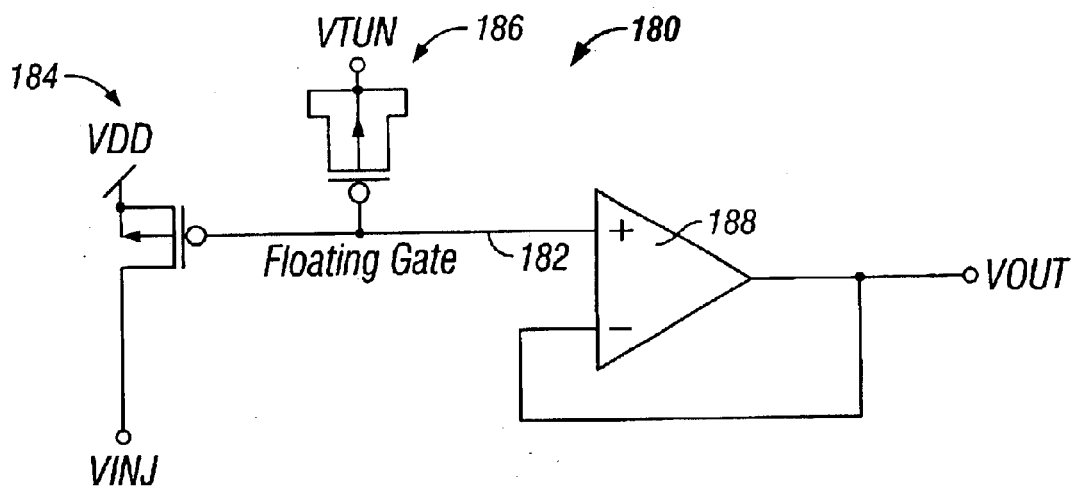
FIG. 9 is an electrical schematic diagram of a voltage trim cell in accordance with one embodiment of the present invention to be used in accordance with the embodiment of FIGS. 7 and 8 when voltage is the electrical parameter to be trimmed.

FIG. 9 is an electrical schematic diagram of a voltage trim cell 180 in accordance with one embodiment of the present invention to be used in accordance with the embodiment of FIGS. 7 and 8 when voltage is the electrical parameter to be trimmed. The negative charge on floating gate 182 is increased by injecting electrons onto floating gate 182 with injector 184. It is decreased by tunneling electrons off of floating gate 182 with tunneling junction 186. Amplifier 188 provides an output at node VOUT in a conventional manner.

Figure 10A:
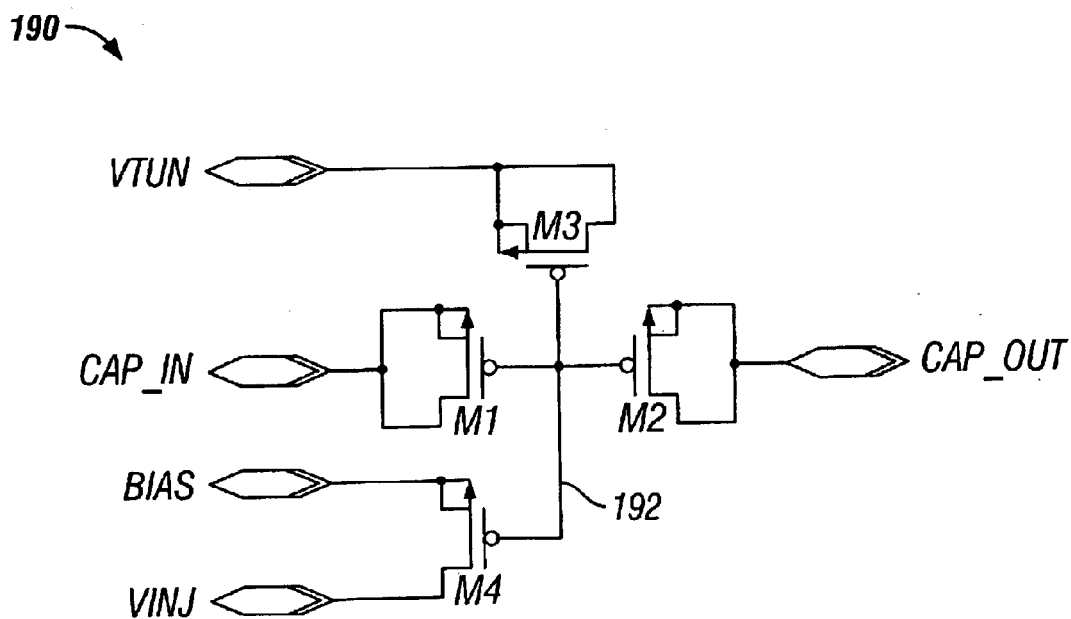
FIG. 10A is an electrical schematic diagram of a capacitance trim cell in accordance with one embodiment of the present invention to be used in accordance with the embodiment of FIGS. 7 and 8 when capacitance is the electrical parameter to be trimmed.
Figure 10B:
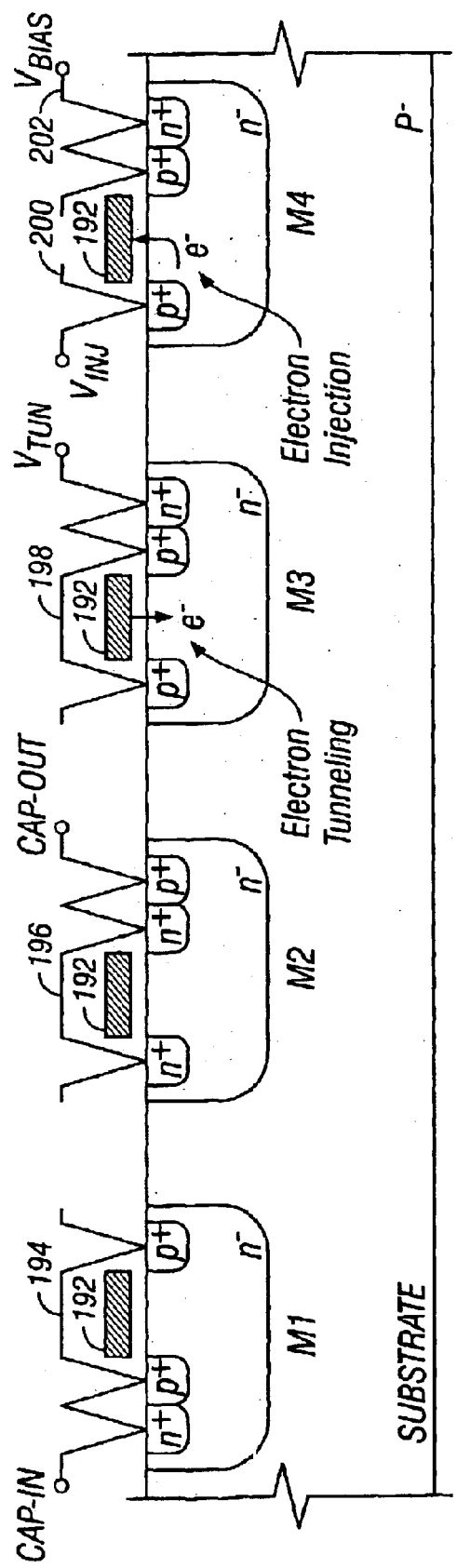
FIG. 10B is a side elevational cross-sectional diagram of the capacitance trim cell of FIG. 10A implemented in a p-doped substrate.
Figure 10C:
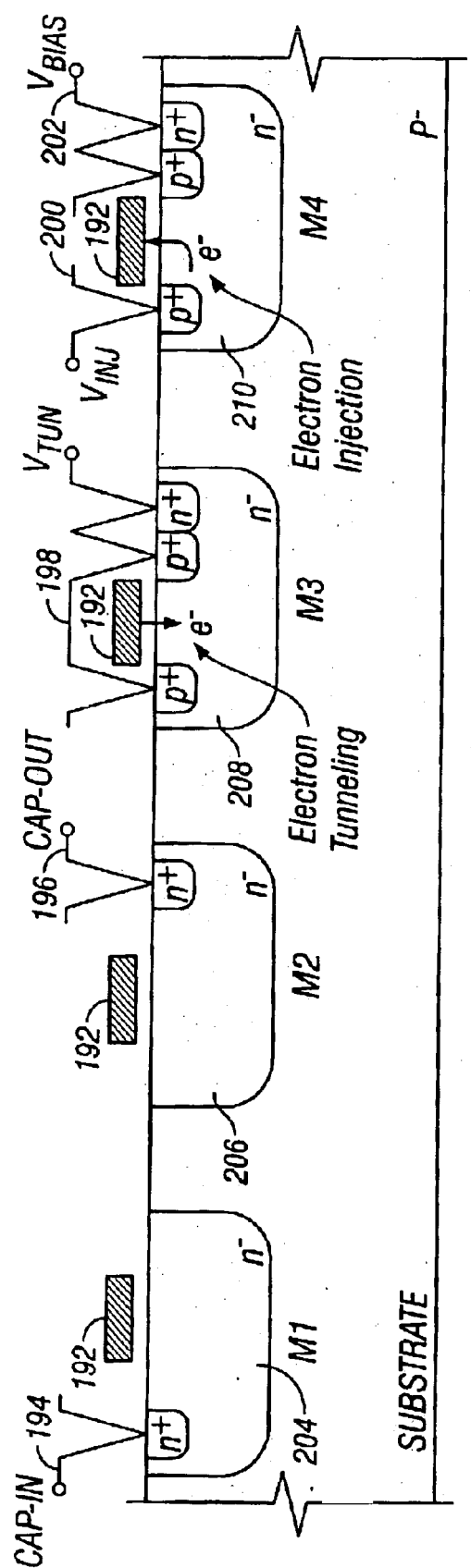
FIGS. 10C, 10D and 10E are side elevational cross-sectional diagrams of alternative embodiments of capacitive trim cells in accordance with the present invention.
Figure 10D:
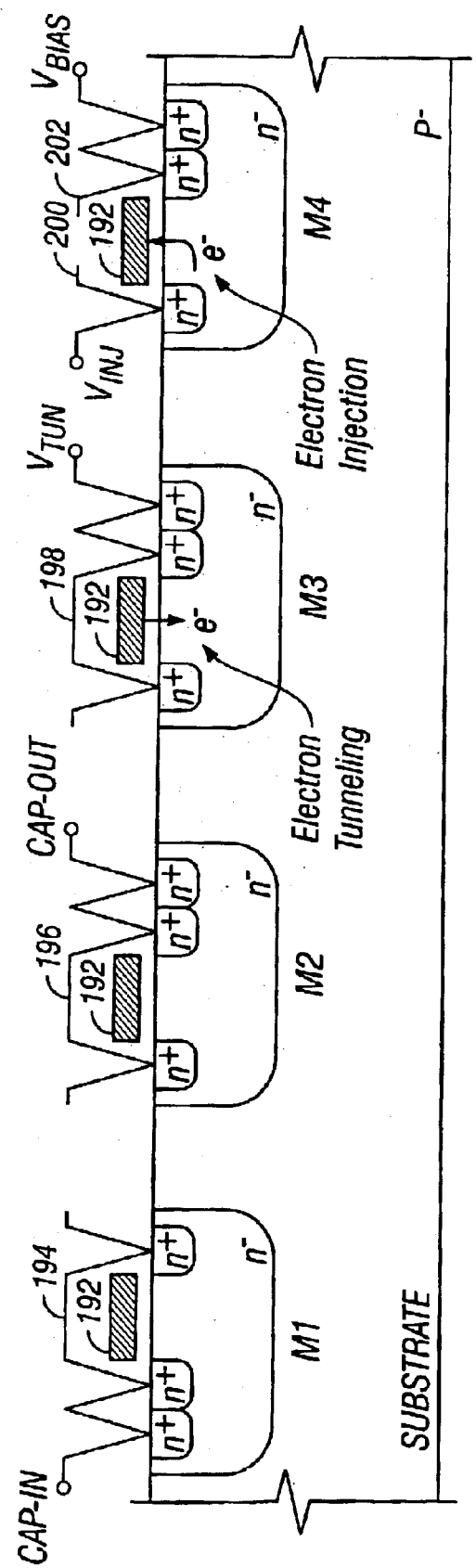
Figure 10E:
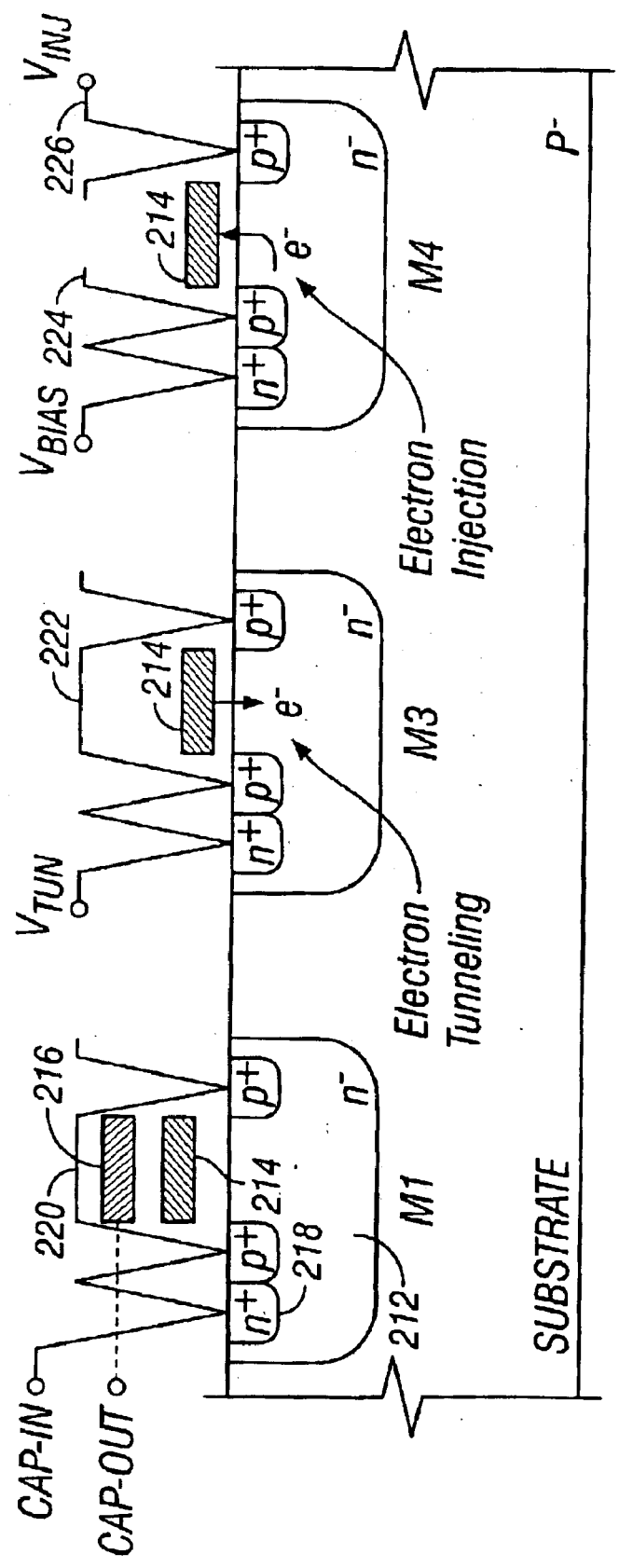

FIG. 10A is an electrical schematic diagram of a capacitance trim cell 190 in accordance with one embodiment of the present invention to be used in accordance with the embodiment of FIGS. 7 and 8 when capacitance is the electrical parameter to be trimmed. FIG. 10B is a side elevational cross-sectional diagram of the capacitance trim cell of FIG. 10A. FIGS. 10C, 10D and 10E are side elevational cross-sectional diagrams of capacitive trim cells in accordance with alternative embodiments of the present invention.

Turning now to FIGS. 10A and 10B, a schematic diagram (FIG. 10A) and a cross sectional elevational diagram (FIG. 10B) of a complete MOS floating gate variable capacitor circuit is shown. In accordance with this embodiment of the present invention, the MOS floating gate variable capacitor 190 is a circuit comprising at least four devices. These are labeled M1, M2, M3 and M4. M1, M2, M3 and M4 all share the same floating gate 192 formed from a poly 1 layer (heavily doped conductive polysilicon). M1 and M2 are a pair of relatively large (9 $\mu$m ×9 $\mu$m) pFET transistors as described above. M1 and M2 are designed to be substantially larger than M3 and M4 and to have correspondingly larger capacitance so that the parasitic capacitance effects of M3 and M4 are overwhelmed by the much larger capacitance of M1 and M2. Since in a plate capacitor, capacitance is a function of area, the example shown in FIG. 10A has the area of the M1 and M2 capacitors being approximately 500 times the area of the M3 and M4 capacitors. The transistor pair M1, M2 and the transistor pair M3, M4 should be substantially the same size as one another and may be connected so that drain, source and well contact are coupled together as shown. Two or more of these devices can be series connected as shown in order to reduce nonlinearity caused by non-uniformity of fabricated devices. In many cases, two (as shown) will be sufficient.

M3 is a tunneling junction device with drain, source and well contact coupled together as shown. It need not be as large as M1 and M2 and, in one embodiment, may be 0.24 $\mu$m ×0.60 $\mu$m. M4 is an injection device of similar size to device M3 configured as described above.

The MOS floating gate variable capacitor 190 has five terminals: Vtun (the tunneling voltage); Vinj (the injection voltage); Bias (the bias voltage applied to the injector M4); Cap_In and Cap_Out (the terminals across which the variable capacitance appears).

The tunneling junction M3 comprises a shorted pFET in an n– well for two primary reasons. First, a lightly-doped n– well can accommodate relatively high positive voltage without pn-junction breakdown to the substrate. Second, a shorted pFET in an n– well is a valid structure (that is, it satisfies the design rules) in any CMOS process.

Key features of the MOS floating gate variable capacitor 190 are: (a) relatively high voltages applied to the tunneling junction M3 tunnel electrons off the common floating gate 192; (b) relatively large drain-to-source voltages at M4 cause IHEI at the drain of M4, injecting electrons onto the common floating gate 192. Those of ordinary skill in the art will now realize that other mechanisms for injecting charge onto the floating gate may also be used, including tunneling. In operation, the large value capacitors M1 and M2 are biased either in inversion or accumulation. By varying the amount of floating-gate charge, the total series capacitance of M1 and M2 may be adjusted by changing the voltage across the individual capacitors. In this manner, two capacitors may be adjusted to set their values equal to one another.

Electron injection is induced by applying a negative voltage (e.g., –2.5 V) to M4's drain. The power supply may be located either off-chip or on-chip and provided by conventional on-chip charge pumps.

Conventional metalization provides the connections 194, 196, 198, 200 and 202 as shown in FIGS. 10B, 10C and 10D.

Turning now to FIG. 10C, an alternative embodiment of the present invention is illustrated. Here the capacitors operate in the accumulation region and thus do not require source or drain regions. The capacitance appears between the common floating gate 192 and the wells 204 and 206, respectively. In other relevant respects the device operates as described above in conjunction with FIG. 10B.

Turning now to FIG. 10D, yet another alternative embodiment of the present invention is illustrated. Here the substrate is p– doped, the wells are all n– doped and the well, source and drain contacts are all n+ doped (the well contact may be omitted). Heavily doped n– type poly is used for the floating gate. This embodiment will work as well for variable capacitor elements.

Turning now to FIG. 10E, another alternative embodiment of the present invention is illustrated. In accordance with the embodiment of FIG. 10E, a double-poly version of the invention is presented. In this version, a MOS device M1 forms a first capacitor having one plate in the well 212 of MOS device M1 and a second plate at the floating gate 214.

A second capacitor is formed between a second gate formed in the poly 2 layer 216 and the common floating gate 214. The two capacitors are series connected at the floating gate and charge transport onto and off of the floating gate is handled as in the device illustrated at FIG. 5A and discussed above. In this case, the capacitance between the first polysilicon layer and the second polysilicon layer remains fixed and only the capacitance between the first polysilicon layer and the well is variable. However, the capacitance across the two capacitor plates, comprised of the well connection 218 of transistor M1 and the second polysilicon layer 216 remains variable. Note that this embodiment may also be modified along the lines of the embodiment shown in FIG. 10C (source and drain on the capacitor devices omitted) and discussed above.

As in the embodiment illustrated in FIG. 10B, conventional metalization provides the connections 220, 222, 224 and 226 shown in FIG. 5E.

Figure 11:
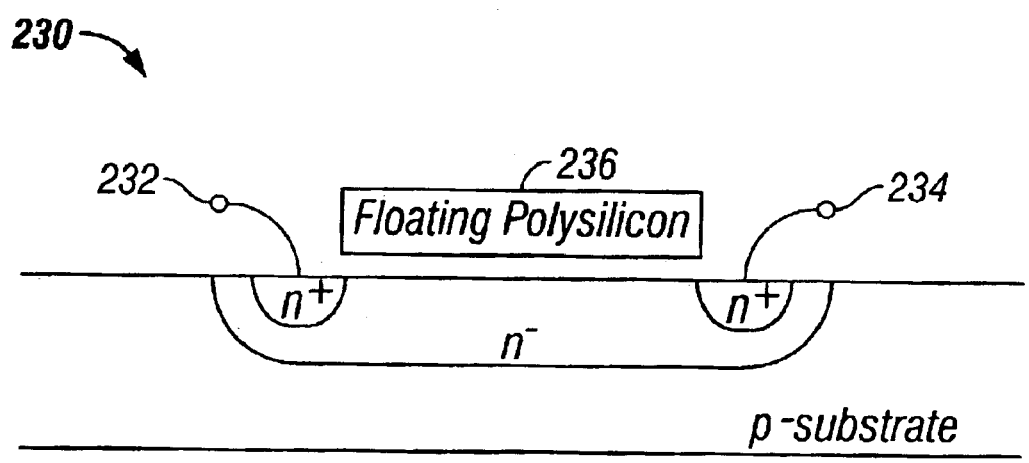
FIG. 11 is a side elevational drawing of a resistance trim cell in accordance with one embodiment of the present invention to be used in accordance with the embodiment of FIGS. 7 and 8 when resistance is the electrical parameter to be trimmed.

FIG. 11 is a side elevational drawing of a resistance trim cell 230 in accordance with one embodiment of the present invention to be used in accordance with the embodiment of FIGS. 7 and 8 when resistance is the electrical parameter to be trimmed. Resistance appearing between nodes 232 and 234 is adjusted by varying the negative charge on floating gate 236 using tunneling to remove electrons and injection to add electrons.

While silicon dioxide ($SiO_2$) is contemplated to be a common dielectric for use as the dielectric in isolating the floating gates of the present invention from each other and from the substrate and its wells, other dielectric materials may be used alone, or in combination with silicon dioxide. For example, any of the following could also be used: nitrided oxide, nitride, oxide/nitride composite, titanium oxide, tantalum oxide, zirconium oxide, hafnium oxide, lanthanum oxide (or any oxide of a lanthanide), titanium silicate, tantalum silicate, zirconium silicate, hafnium silicate and lanthanum silicate (or any silicate of a lanthanide) and composite or multilayer structures thereof. These alternative dielectrics generally provide higher dielectric constants and can therefore be utilized in thinner layers than silicon dioxide.

It should also be noted that the floating gates referred to herein may include conductive polysilicon as well as "metals" such as aluminum, copper, titanium, and the like.

While embodiments and applications of this invention have been shown and described, it would be apparent to those skilled in the art having the benefit of this disclosure that many more modifications than mentioned above are possible without departing from the inventive concepts herein. For example, it is to be noted that while the present invention may be implemented in a single well single poly process and will work with low voltage processes (e.g., <=3 volts), the invention is not so limited and can be implemented in processes that support multiple polysilicon layers, multiple wells, and/or in higher voltage devices. Furthermore, the concept of an n- well as used herein is intended to encompass not only conventional n- well devices, but also NLDD (N-type Lightly Doped Drain) devices and other lightly doped, or isolated structures that increase the reliable gate-drain and drain-source voltages of the device so that it, in effect, behaves like a conventional n- well device in this respect. The invention, therefore, is not to be restricted except in the spirit of the appended claims.

What is claimed is:

1. An electrical circuit having an N-bit input, for N an integer of at least 2, and an output including an electrical parameter, said electrical circuit comprising:

N+1 cells for generating a relatively fixed output of the parameter;

N+1 trim cells, each corresponding to one of the N+1 cells, for generating a trimmable output of the parameter, each trim cell adapted to operate in one of two modes, generating a trimmable output of a first magnitude of the parameter in the first mode and generating a trimmable output of twice the first magnitude of the parameter in a second mode;

N+1 combiners for combining the value of the parameter from a cell with the value of the parameter from a corresponding trim cell to form a combined parameter output;

a first bus combining combined parameter outputs directed thereto to form a first bus parameter value;

a second bus combining combined parameter outputs directed thereto to form a second bus parameter value;

N+1 switches for directing the combined parameter output from each combiner to one of the first bus and the second bus; and an additional switch for decoupling one of the combiners from both the first bus and the second bus.

2. The electrical circuit in accordance with claim 1, further comprising a comparator comparing a bus parameter value with a reference value.

3. The electrical circuit in accordance with claim 1 wherein each trim cell includes a floating-gate transistor.

4. The electrical circuit in accordance with claim 3 wherein the trimmable output of the parameter provided by the trim cells is responsive to an amount of electrical charge stored on a floating gate of said floating-gate transistor.

5. The electrical circuit in accordance with claim 4, further comprising a comparator comparing a bus parameter value with a reference value.

6. The electrical circuit in accordance with claim 5, wherein the parameter is electrical current.

7. The electrical circuit in accordance with claim 5, wherein the parameter is electrical potential.

8. The electrical circuit in accordance with claim 5, wherein the parameter is electrical capacitance.

9. The electrical circuit in accordance with claim 5, wherein the parameter is electrical resistance.

10. The electrical circuit in accordance with claim 1, wherein the parameter is electrical current.

11. The electrical circuit in accordance with claim 1, wherein the parameter is electrical potential.

12. The electrical circuit in accordance with claim 1, wherein the parameter is electrical capacitance.

13. The electrical circuit in accordance with claim 1, wherein the parameter is electrical resistance.

14. A digital-to-analog converter (DAC), comprising:

a digital input;

a current-source element responsive to the digital input sourcing a current having a total current magnitude;

a trim cell associated with the current-source element, the trim cell having an adjustable trim current which is added to an output current of the current-source element, the trim cell operable to selectably output one times the adjustable trim current and two times the adjustable current; and a memory associated with the trim cell, wherein the trim current magnitude sourced by the trim cell is responsive to said memory.

15. A DAC in accordance with claim 14, wherein said memory is a nonvolatile memory.

16. A DAC in accordance with claim 15, wherein said nonvolatile memory includes a floating gate for storing charge.

17. A DAC in accordance with claim 16, wherein said floating gate stores an analog charge value.

18. A DAC in accordance with claim 17 wherein said nonvolatile memory is the floating gate of a floating-gate transistor.

19. A DAC in accordance with claim 18 wherein said floating-gate transistor is a p-channel MOSFET.

20. A digital-to-analog converter (DAC), comprising:
a codeword register receiving a digital codeword for conversion to an analog current signal;
a current-source responsive to a state of the codeword register;
a trim device coupled to the current-source, wherein the current-source outputs a current-source current output and the trim device outputs a trim current which together provide a combined current output, said trim device including a memory storing a trim weight used by the trim device to adjust said combined current output, said trim device further including an input for selectively controlling whether the trim device outputs a current of one times said trim current or two times said trim current.

21. A DAC in accordance with claim 20, wherein said memory is a nonvolatile memory.

22. A DAC in accordance with claim 21, wherein said nonvolatile memory includes a floating gate for storing charge.

23. A DAC in accordance with claim 22, wherein said floating gate stores an analog charge value.

24. A DAC in accordance with claim 23 wherein said nonvolatile memory is the floating gate of a floating-gate transistor.

25. A DAC in accordance with claim 24 wherein said floating-gate transistor is a p-channel MOSFET.

26. A trimmable current-source element for a current-steering-type digital-to-analog converter (DAC), said element comprising:
a first current-source transistor having a source and a drain and sourcing a first magnitude of current to an output node; and
a trim cell sourcing an adjustable trim current of a second magnitude coupled to add to current provided to said output node, said trim cell including a memory, said second magnitude of current responsive to said memory, said trim cell including an input for selectively directing said trim cell to output one times said trim current or two times said trim current based upon a state of a signal applied to said input.

27. A trimmable current-source element in accordance with claim 26, wherein said memory is a nonvolatile memory.

28. A trimmable current-source element in accordance with claim 27, wherein said nonvolatile memory is a floating gate of said first current-source transistor.

29. A trimmable current-source element in accordance with claim 28, further comprising:
a tunneling device coupled to remove electrons from said floating gate in response to application of a tunneling control voltage to said tunneling device.

30. A trimmable current-source element in accordance with claim 29, further comprising:
an injector coupled to inject electrons onto said floating gate in response to application of an injection control voltage to said injector.

31. A digital-to-analog converter (DAC), comprising
means for buffering a digital codeword for conversion to an analog current signal;
means for generating an output current at an output node responsive to a state of said buffering means;
means for trimming said output current, said trimming means including non-volatile memory means for controlling a current output of said trimming means and means for selectively scaling said current output of said trimming means.

32. A DAC in accordance with claim 31, wherein said nonvolatile memory means includes a floating gate for storing a charge.

33. A DAC in accordance with claim 32, further comprising means for erasing said floating gate.

34. A DAC in accordance with claim 33, wherein said erasing means includes a means for tunneling electrons off of said floating gate.

35. A method for trimming a current-steering-type digital-to-analog converter (DAC), the DAC including an N-bit input codeword register and a plurality of N+1 trimmable current-source elements, one of said trimmable current-source elements associated with each of said N bits of the codeword register and an extra, each current-source element having:
a current source device sourcing a first current to a first node; and
a trim device having a floating gate, an output node coupled to said first node to add a second current sourced from the trim device to said first current sourced by said current source device, a device coupled to transfer electrons onto said floating gate in response to application of an add electron control signal, a device coupled to transfer electrons from said floating gate in response to application of a remove electrons control signal, and a selector input to selectively scale said second current in response to a state of a signal applied to said selector input, said method comprising:
starting with the highest order bit i=N and repeating N times with successively lower order bits so as to end with bit 1:
erasing the floating gate of the trim device associated with bit i to zero said second current;
trimming the second current of said extra current-source element so that a sum of the magnitudes of the output currents of all lower order bit i total currents added to the magnitude of the total current of the extra current-source element becomes equal to the bit i total current;
configuring the bit i trim device to scale its current output; and
trimming the second current of the trim device associated with bit i so that the sum of (1) the first current of bit i, (2) the scaled bit i trim device current output, (3) the total current of all lower order bits, (4) the total current of all higher order bits, and (5) the total current of the extra current-source element are equal to a reference current.

36. A method for trimming a current-steering-type digital-to-analog converter (DAC), the DAC including an N-bit input codeword register and a plurality of N+1 current-source elements, each current-source element outputting a current formed from the sum of a first current from a current-source device and a second adjustable current from a trim device, one of the current-source elements associated with each of the N bits of the register and an extra current-source element, each trim device including a floating gate, an output coupled to add the second adjustable current sourced from the trim device to said first current sourced by said current-source device to form a bit i total current output, a device coupled to transfer electrons onto said floating gate in response to application of an add electron control signal, a device coupled to transfer electrons from said floating gate in response to application of a remove electrons control signal, and a selector input to selectively scale said second current in response to a state of a signal applied to said selector input, said method comprising:

starting with the highest order bit i=N and repeating N times with successively lower order bits so as to end with bit 1:
  erasing the floating gate of the trim device associated with bit i to zero said second current for bit i;
  trimming the second current of said extra current-source element so that a sum of the magnitudes of the output currents of all lower order bit i total currents added to the magnitude of the total current of the extra current-source element becomes equal to the bit i total current;
  configuring the bit i trim device to scale its current output; and
  trimming the second current of the trim device associated with bit i so that the sum of (1) the first current of bit i, (2) the scaled bit i trim device current output, (3) the total current of all lower order bits, (4) the total current of all higher order bits, and (5) the total current of the extra current-source element are equal to a reference current.

37. A method for trimming a current-steering-type digital-to-analog converter (DAC), the DAC including an N-bit input codeword register and a plurality of N+1 current-source elements, each current-source element outputting a current formed from the sum of a first current from a current-source device and a second adjustable current from a trim device, one of the current-source elements associated with each of the N bits of the register and an extra current-source element, each trim device including a floating gate, an output coupled to add the second adjustable current sourced from the trim device to said first current sourced by said current-source device to form a bit i total current output, a device coupled to transfer electrons onto said floating gate in response to application of an add electron control signal, a device coupled to transfer electrons from said floating gate in response to application of a remove electrons control signal, and a selector input to selectively scale said second current in response to a state of a signal applied to said selector input, said method comprising:

configuring a reference current source to output a reference current;
erasing the floating gate of the N+1 trim devices; and
starting with the highest order bit i=N and repeating N times with successively lower order bits so as to end with bit 1:
  trimming the second current of said extra current-source element so that a sum of the magnitudes of the output currents of all lower order bit i total currents added to the magnitude of the total current of the extra current-source element becomes equal to the bit i total current;
  configuring the bit i him device to scale its current output; and
  trimming the second current of the trim device associated with bit i so that the sum of (1) the first current of bit i, (2) the scaled bit i trim device current output, (3) the total current of all lower order bits, (4) the total current of all higher order bits, and (5) the total current of the extra current-source element are equal to the reference current.

38. A method for trimming a current-steering-type digital-to-analog converter (DAC), the DAC including an N-bit input codeword register and a plurality of N+1 current-source elements, each current-source element outputting a current formed from the sum of a first current from a current-source device and a second adjustable current from a trim device, one of the current-source elements associated with each of the N bits of the register and an extra current-source element, each trim device including an output coupled to add the second adjustable current sourced from the trim device to said first current sourced by said current-source device to form a bit i total current output and a selector input to selectively scale said second current in response to a state of a signal applied to said selector input, said method comprising:

configuring a reference current source to output a reference current;
zeroing the second current sources; and
starting with the highest order bit i=N and repeating N times with successively lower order bits so as to end with bit 1:
  trimming the second current of said extra current-source element so that a sum of the magnitudes of the output currents of all lower order bit i total currents added to the magnitude of the total current of the extra current-source element becomes equal to the bit i total current;
  configuring the bit i trim device to scale its current output; and
  trimming the second current of the trim device associated with bit i so that the sum of (1) the first current of bit i, (2) the scaled bit i trim device current output, (3) the total current of all lower order bits, (4) the total current of all higher order bits, and (5) the total current of the extra current-source element are equal to the reference current.

39. A method for trimming an electronic circuit including an N-bit input codeword register and a plurality of N+1 trimmable elements, one of said trimmable elements associated with each of said N bits of the codeword register and an extra, each element having:
  a parameter device sourcing a first relatively fixed quantity of a parameter to a first node; and
  a trim device having a floating gate, an output node coupled to said first node to add a second adjustable quantity of the parameter sourced from the trim device to said first quantity sourced by said parameter device, a device coupled to transfer electrons onto said floating gate in response to application of an add electron control signal, a device coupled to transfer electrons from said floating gate in response to application of a remove electrons control signal, and a selector input to selectively scale the value of said second adjustable quantity of the parameter in response to a state of a signal applied to said selector input, said method comprising:

starting with the highest order bit i=N and repeating N times with successively lower order bits so as to end with bit 1:
  erasing the floating gate of the trim device associated with bit i to zero said second current;
  trimming the second adjustable quantity of the parameter sourced from the trim device associated with the extra current-source element so that a sum of the magnitudes of the output parameters of all lower order bit i total parameters added to the magnitude of the total output of the parameter of the extra current-source element becomes equal to the bit i total output of the parameter;

configuring the bit i trim device to scale its parameter output; and trimming the second parameter output of the trim device associated with bit i so that the sum of (1) the first parameter output of bit i, (2) the scaled bit i trim device parameter output, (3) the total parameter output of all lower order bits, (4) the total parameter output of all higher order bits, and (5) the total parameter output of the extra current-source element are equal to a reference parameter output.

40. A method for trimming an electronic circuit, the circuit including an N-bit input codeword register and a plurality of N+1 parameter-source elements, each parameter-source element outputting a quantity of a parameter formed from the sum of a first amount of the parameter from a parameter-source device and a second adjustable amount of the parameter from a trim device, one of the parameter-source elements associated with each of the N bits of the register and an extra parameter-source element, each trim device including a floating gate, an output coupled to add the second adjustable amount of the parameter sourced from the trim device to said first amount of the parameter sourced by said parameter-source device to form a bit i total parameter output, a device coupled to transfer electrons onto said floating gate in response to application of an add electron control signal, a device coupled to transfer electrons from said floating gate in response to application of a remove electrons control signal, and a selector input to selectively scale said second adjustable amount of parameter in response to a state of a signal applied to said selector input, said method comprising:

starting-with the highest order bit i=N and repeating N times with successively lower order bits so as to end with bit 1:

erasing the floating gate of the trim device associated with bit i to zero said second parameter output for bit i;

trimming the second parameter output of said extra parameter-source element so that a sum of the magnitudes of the parameter outputs of all lower order bit i total parameter amounts added to the magnitude of the total parameter amount of the extra parameter-source element becomes equal to the bit i total current;

configuring the bit i trim device to scale its parameter amount output; and trimming the second parameter output of the trim device associated with bit i so that the sum of (1) the first parameter output of bit i, (2) the scaled bit i trim device parameter output, (3) the total parameter output of all lower order bits, (4) the total parameter output of all higher order bits, and (5) the total parameter output of the extra parameter-source element are equal to a reference current.

41. A method for trimming an electrical circuit, the circuit including an N-bit input codeword register and a plurality of N+1 parameter-source elements, each parameter-source element outputting a quantity of a parameter formed from the sum of a first amount of the parameter from a parameter-source device and a second adjustable amount of the parameter from a trim device, one of the parameter-source elements associated with each of the N bits of the register and an extra parameter-source element, each trim device including a floating gate, an output coupled to add the second adjustable amount of the parameter sourced from the trim device to said first amount of the parameter sourced by said parameter-source device to form a bit i total parameter output, a device coupled to transfer electrons onto said floating gate in response to application of an add electron control signal, a device coupled to transfer electrons from said floating gate in response to application of a remove electrons control signal, and a selector input to selectively scale said adjustable amount pf the parameter in response to a state of a signal applied to said selector input, said method comprising:

configuring a reference parameter source to output a reference quantity of the parameter;

erasing the floating gate of the N+1 trim devices; and starting with the highest order bit i=N and repeating N times with successively lower order bits so as to end with bit 1:

trimming the second parameter output of said extra parameter-source clement so that a sum of the magnitudes of the parameter outputs of all lower order bit i total parameter outputs added to the magnitude of the total parameter output of the extra parameter-source element becomes equal to the bit i total parameter output;

configuring the bit i trim device to scale its parameter output; and trimming the second parameter output of the trim device associated with bit i so that the sum of (1) the first parameter output of bit i, (2) the scaled bit i trim device parameter output, (3) the total parameter output of all lower order bits, (4) the total parameter output of all higher order bits, and (5) the total parameter output of the extra parameter-source element are equal to the reference quantity of the parameter.

42. A method for trimming an electric circuit, the circuit including an N-bit input codeword register and a plurality of N+1 parameter-source elements, each parameter-source element outputting an amount of a parameter formed from the sum of a first parameter output from a parameter-source device and a second adjustable parameter output from a trim device, one of the parameter-source elements associated with each of the N bits of the register and an extra parameter-source element, each trim device including an output coupled to add the second adjustable amount of parameter sourced from the trim device to said first parameter output sourced by said parameter-source device to form a bit i total parameter output and a selector input to selectively scale said second parameter output in response to a state of a signal applied to said selector input, said method comprising:

configuring a reference parameter source to output a reference parameter quantity;

zeroing the second parameter sources; and starting with the highest order bit i=N and repeating N times with successively lower order bits so as to end with bit 1:

trimming the second parameter output of said extra parameter-source element so that a sum of the magnitudes of the parameter outputs of all lower order bit i total parameter outputs added to the magnitude of the total parameter output of the extra parameter-source element becomes equal to the bit i total parameter output;

configuring the bit i trim device to scale its parameter output; and trimming the second parameter output of the trim device associated with bit i so that the sum of (1) the first parameter output of bit i, (2) the scaled bit i trim device parameter output, (3) the total parameter output of all lower order bits, (4) the total parameter output of all higher order bits, and (S) the total parameter output of the extra current-source element are equal to the reference parameter quantity.

43. An electrical circuit having an N-bit input, for N an integer of at least 2, and an output including an electrical parameter, said electrical circuit comprising:

N+1 cells for generating a relatively fixed output of the parameter;

N+1 trim cells, each corresponding to one of the N+1 cells, for generating a trimmable output of the parameter;

N+1 combiners for combining the value of the parameter from a cell with the value of the parameter from a corresponding trim cell to form a combined parameter output;

a first bus combining combined parameter outputs directed thereto to form a first bus parameter value;

a second bus combining combined parameter outputs directed thereto to form a second bus parameter value;

N+1 switches for directing the combined parameter output from each combiner to one of the first bus and the second bus; and an additional switch for decoupling one of the combiners from both the first bus and the second bus, the additional switch associated with a first of the N+1 cells, wherein the magnitudes of the relatively fixed output of the parameter from the jth of the N+1 cells, for integer values of j between 2 and N+1, is X multiplied by $K^{j-2}$ where X is the magnitude of the relatively fixed output of the first of the N+1 cells and K is a numerical base.

44. The electrical circuit in accordance with claim 43, further comprising a comparator comparing a bus parameter value with a reference value.

45. The electrical circuit in accordance with claim 43 wherein each trim cell includes a floating-gate transistor.

46. The electrical circuit in accordance with claim 45 wherein the trimmable output of the parameter provided by the trim cells is responsive to an amount of electrical charge stored on a floating gate of said floating-gate transistor.

47. The electrical circuit in accordance with claim 46, further comprising a comparator comparing a bus parameter value with a reference value.

48. The electrical circuit in accordance with claim 47, wherein the parameter is electrical current.

49. The electrical circuit in accordance with claim 47, wherein the parameter is electrical potential.

50. The electrical circuit in accordance with claim 47, wherein the parameter is electrical capacitance.

51. The electrical circuit in accordance with claim 47, wherein the parameter is electrical resistance.

52. The electrical circuit in accordance with claim 43, wherein the parameter is electrical current.

53. The electrical circuit in accordance with claim 43, wherein the parameter is electrical potential.

54. The electrical circuit in accordance with claim 43, wherein the parameter is electrical capacitance.

55. The electrical circuit in accordance with claim 43, wherein the parameter is electrical resistance.

* * * * *

UNITED STATES PATENT AND TRADEMARK OFFICE
CERTIFICATE OF CORRECTION

| | | |
|---|---|---|
| PATENT NO. | : 6,909,389 B1 | Page 1 of 1 |
| APPLICATION NO. | : 10/281384 | |
| DATED | : June 21, 2005 | |
| INVENTOR(S) | : Hyde et al. | |

It is certified that error appears in the above-identified patent and that said Letters Patent is hereby corrected as shown below:

In column 5 line 15, replace "Bugej a" with --Bugeja--.

In column 7 line 52, replace "on-hip" with --on-chip--.

In column 8 line 48, replace "arc" with --are--.

In column 10 line 31, replace "N-I" with --N-1--.

In column 11 line 4, replace "b.sub.i" with --b.sub.1--.

In column 17 line 63, replace "bit i him" with --bit i trim--.

In column 20 line 22, replace "clement" with --element--.

In column 21 line 8, replace "(S)" with --(5)--.

On the front page, in section (57) Abstract, line 2 replace "required" with --requires--.

Signed and Sealed this

First Day of August, 2006

JON W. DUDAS
*Director of the United States Patent and Trademark Office*